US012761287B2

(12) United States Patent
Li

(10) Patent No.: US 12,761,287 B2
(45) Date of Patent: Oct. 13, 2026

(54) DEVICES, SYSTEMS, AND METHODS FOR MONITORING BATTERY MODULES

(71) Applicant: O2Micro Inc., Santa Clara, CA (US)

(72) Inventor: Guoxing Li, Sunnyvale, CA (US)

(73) Assignee: O2Micro Inc., Santa Clara, CA (US)

( * ) Notice: Subject to any disclaimer, the term of this patent is extended or adjusted under 35 U.S.C. 154(b) by 263 days.

(21) Appl. No.: 18/527,055

(22) Filed: Dec. 1, 2023

(65) Prior Publication Data

US 2025/0180664 A1 Jun. 5, 2025

(51) Int. Cl.
*G01R 31/396* (2019.01)
*G01R 31/3835* (2019.01)

(52) U.S. Cl.
CPC ....... *G01R 31/396* (2019.01); *G01R 31/3835* (2019.01)

(58) Field of Classification Search
CPC .......................... G01R 31/396; G01R 31/3835
See application file for complete search history.

(56) References Cited

U.S. PATENT DOCUMENTS

| | | | | |
|---|---|---|---|---|
| 10,775,443 B2 * | 9/2020 | Yamada | .............. | H01M 10/482 |
| 10,944,133 B2 * | 3/2021 | Marsili | ................. | H01M 10/48 |
| 10,992,149 B1 * | 4/2021 | Kahn | ................. | H01M 10/482 |
| 2023/0098055 A1 * | 3/2023 | Allag | ................. | H02J 7/00036 324/432 |

FOREIGN PATENT DOCUMENTS

WO 2023055625 A1 4/2023

* cited by examiner

*Primary Examiner* — Walter L Lindsay, Jr.
*Assistant Examiner* — Milton Gonzalez

(57) ABSTRACT

A battery monitoring device includes a monitoring circuit, a communication port, and a control circuit. The communication port receives a sensing command from a battery management unit through a set of other battery monitoring devices. The control circuit starts timing of a preset time delay when the control circuit executes the sensing command, and controls the monitoring circuit to sense a status of a first battery module when the preset time delay expires such that the monitoring circuit senses the status of the first battery module at a time point that is synchronized with a sensing time point of the other battery monitoring devices. The control circuit controls the communication port to send information including the status of the first battery module to the battery management unit through the other battery monitoring devices.

17 Claims, 11 Drawing Sheets

DEVICES, SYSTEMS, AND METHODS FOR MONITORING BATTERY MODULES

BACKGROUND

FIG. 1 illustrates a block diagram of a conventional battery monitoring system 100. The battery monitoring system 100 includes multiple battery modules **102_1-102_*n* (n=2, 3, 4, . . . ), multiple analog front ends (AFEs) 104_1-104_*n*, multiple isolators 106, and a battery management unit (BMU) 108. As shown in FIG. 1, each of the AFEs 104_1-104_*n* is coupled to a respective battery module of the battery modules 102_1-102_*n*, and is configured to monitor a status, e.g., a voltage, of the respective battery module. Each pair of adjacently coupled AFEs 104_1-104_*n* are coupled to each other through an isolator 106. The AFE 104_1 is coupled to the BMU 108, and the AFEs 104_2-104_*n* are coupled to the BMU 108 through the AFE 104_1**.

A daisy-chain communication link can be established among the BMU 108 and the AFEs **104_1-104_*n*. Through the daisy-chain communication link, the BMU 108 can control the AFEs 104_1-104_*n* to monitor the statuses of the battery modules 102_1-102_*n*, and obtain the status information of the battery modules 102_1-102_*n*. Specifically, the BMU 108 can send a status monitoring command SMC to the AFEs 104_1-104_*n* through the daisy-chain communication link, and the status monitoring command SMC is set to instruct the AFEs 104_1-104_*n* to monitor the statuses of the battery modules. In response to the status monitoring command SMC, the AFEs 104_1-104_*n* can obtain the status information of the battery modules and send the status information to the BMU 108** through the daisy-chain communication link.

In the daisy-chain communication link, the status monitoring command SMC is relayed to the AFEs **104_1-104_*n* sequentially. Specifically, the BMU 108 sends the status monitoring command SMC to the AFE 104_1. The status monitoring command SMC is forwarded by the AFE 104_1 to the AFE 104_2, which in turn forwards that command to the AFE 104_3, and so on to the AFE 104_*n* in sequence. Each AFE monitors the status of a respective battery module in response to the status monitoring command SMC, and sends the obtained status information to the BMU 108 through the daisy-chain communication link. For example, the AFE_1 sends its status information to the BMU 108, the AFE 104_2 sends its status information to the AFE 104_1, which sends the status information from the AFE 104_2 to the BMU 108**, and so on.

However, there is a propagation delay for each AFE in forwarding the status monitoring command SMC. As a result, the acquisition time of the status information of the battery module acquired by each AFE of the AFEs **104_1-104_*n* is different, which may lead to inaccuracy when using the status information of the battery modules 102_1-102_*n*** to determine battery statuses such as state-of-charge (SOC) and state-of-health (SOH).

SUMMARY

In an embodiment, a battery monitoring device includes a monitoring circuit, a communication port, and a control circuit coupled to the monitoring circuit and the communication port. The monitoring circuit can sense a status of a first battery module. The communication port can receive a sensing command, provided by a battery management unit, through a serial communication link. The serial communication link includes a set of battery monitoring devices that includes the battery monitoring device. The battery monitoring devices are coupled to a set of battery modules that includes the first battery module. Each device of the battery monitoring devices can sense a status of a respective battery module of the battery modules at a sensing time point. The control circuit can start timing of a preset time delay when the control circuit begins executing the sensing command. The control circuit can also control the monitoring circuit to sense the status of the first battery module when the preset time delay expires such that the monitoring circuit senses the status of the first battery module at a time point that is synchronized with the sensing time point. In addition, the control circuit can control the communication port to send information including the status of the first battery module to the battery management unit through the serial communication link.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications, and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Embodiments of the present invention provide a battery monitoring device, a battery monitoring system, and a method for monitoring a battery pack that includes multiple battery modules. The battery monitoring system can include a serial communication link that includes multiple battery monitoring devices and can also include a battery management unit (BMU) that communicates with each of the battery monitoring devices through the serial communication link. Each of the battery monitoring devices can receive a sensing command from the BMU through the serial communication link, set a respective time delay upon receiving or executing the sensing command, and start sensing a status of a respective battery module when the respective time delay expires. As a result, the battery monitoring devices in the serial communication link can sense statuses of the battery modules synchronously, thereby improving the accuracy of determining the statuses such as SOC and/or SOH of the battery modules.

Figure 1:
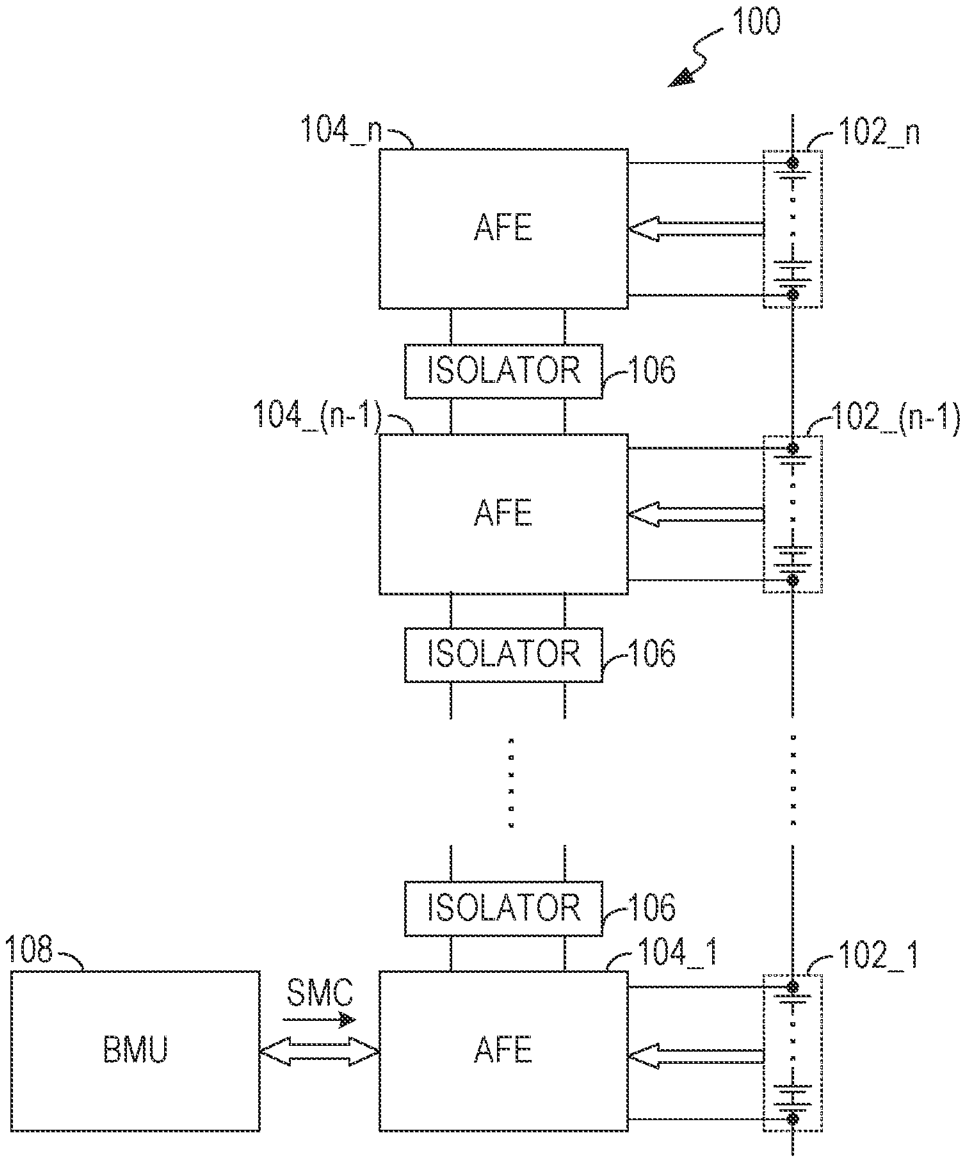
FIG. 1 PRIOR ART
FIG. 1 illustrates a block diagram showing selected elements and components of a conventional battery monitoring system.
Figure 2A:
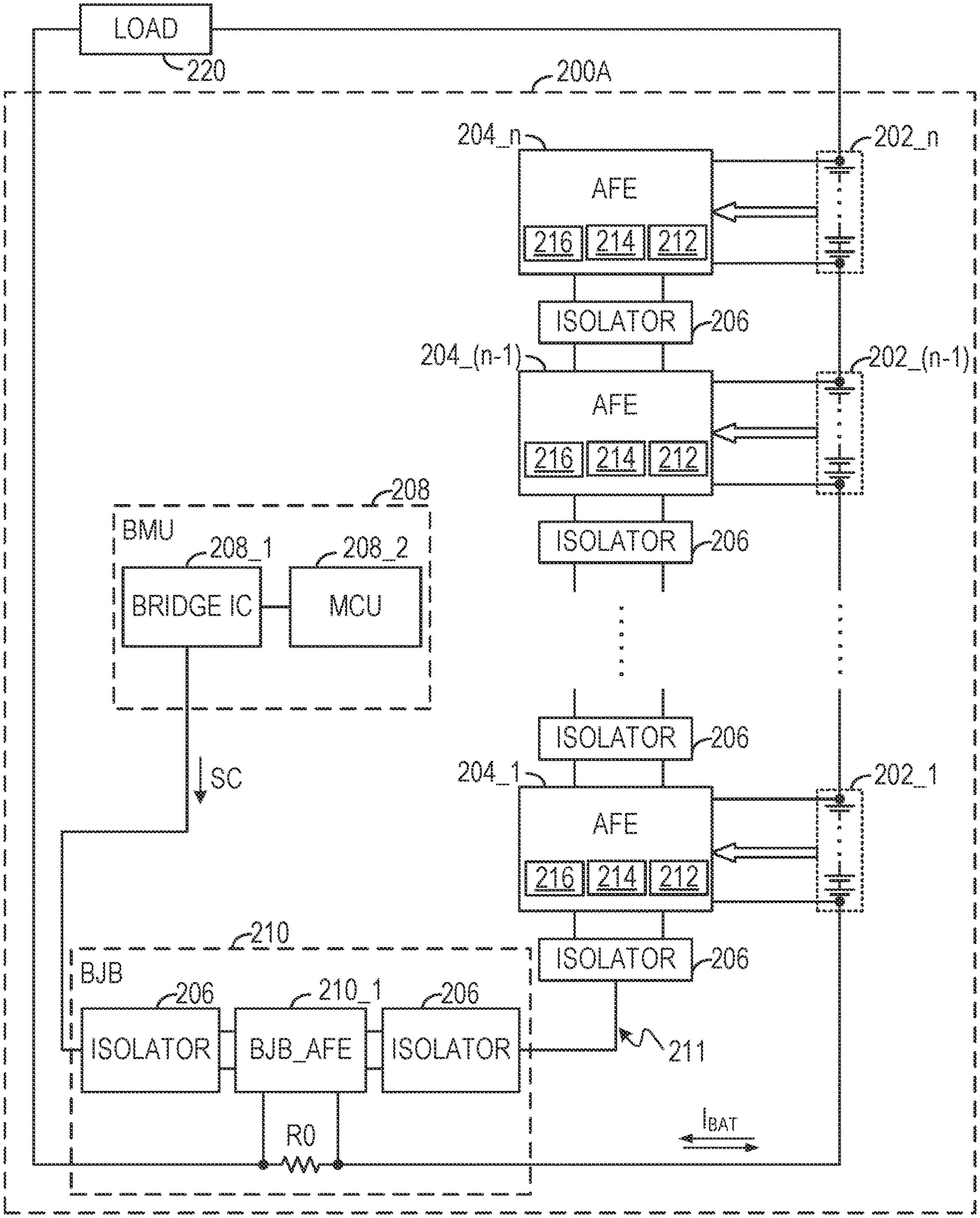
FIG. 2A illustrates a circuit diagram showing selected elements and components of an example of a battery monitoring system, in an embodiment of the present invention.

FIG. 2A illustrates a circuit diagram showing selected elements and components of an example of a battery monitoring system 200A, in an embodiment of the present invention. The battery monitoring system 200A includes multiple battery monitoring devices 204_1-204_*n* (n=2, 3, 4, . . . ). Each of the battery monitoring devices 204_1-204_*n* includes a respective monitoring circuit 212, a respective communication port 214, and a respective control circuit 216. As shown in FIG. 2A, the battery monitoring system 200A can further include multiple battery modules 202_1-202_*n*, multiple isolators 206, a battery junction box (BJB) 210, and a battery management unit (BMU) 208.

In an embodiment, each of the battery monitoring devices 204_1-204_*n* can monitor the status(es) (e.g., voltages, temperature, and/or abnormal conditions, etc.) of a respective battery module. Each of the battery monitoring devices 204_1-204_*n* can include, but is not limited to, an analog front end (AFE). Each battery module of the battery modules 202_1-202_*n* can include multiple battery cells.

In the embodiment of FIG. 2A, each battery module 202_1-202_*n* includes multiple battery cells coupled in series. However, the invention is not so limited. In another embodiment, each battery module 202_1-202_*n* includes multiple battery cells coupled in parallel.

In an embodiment, the battery cells of each battery module 202_1-202_*n* include rechargeable battery cells such as lithium-ion (Li-ion) battery cells. In other embodiments, the multiple battery cells include other types of rechargeable battery cells such as lead-acid battery cells, nickel-cadmium (NiCd) battery cells, nickel-metal hydride (NiMH) battery cells, sodium battery, or super-capacitors. The battery modules 202_1-202_*n* can be used in high power application environments, such as electric vehicles (EVs), power walls, and so on. As shown in FIG. 2A, the battery modules 202_1-202_*n* can be coupled to a load 220 and provide electrical power to the load 220.

As shown in FIG. 2A, the battery modules 202_1-202_*n* are coupled in series. The battery monitoring devices 204_1-204_*n* are coupled in a daisy-chain communication link. Each pair of adjacently coupled battery monitoring devices 204_1-204_*n* is coupled through a respective isolator 206. To illustrate, taking the $j^{th}$ (j=2, . . . , n−1) battery monitoring device 204*j* of the battery monitoring devices 204_1-204_*n* as an example, the communication port 214 of the battery monitoring device 204_*j* can include a first communication port and a second communication port. The first communication port of battery monitoring device 204*j* can be coupled to the battery monitoring device 204_(j−1) via an isolator 206, and the second communication port of the battery monitoring device 204*j* can be coupled to the battery monitoring device 204_(j+1) via another isolator 206. In addition, the communication port 214 of the battery monitoring device 204_1 can also include a first communication port and a second communication port. The first communication port of the battery monitoring device 204_1 can be coupled to the BJB 210 via an isolator 206, and the second communication port of the battery monitoring device 204_1 can be coupled to the battery monitoring device 204_2 via another isolator 206.

In an embodiment, the monitoring circuit 212 in each of the battery monitoring devices 204_1-204_*n* is coupled to a respective battery module of the battery modules 202_1-202_*n*, and is configured to monitor the status of their respective battery module. To illustrate, taking the $k^{th}$ (k=1, 2, . . . , n) battery monitoring device 204_*k* as an example, the monitoring circuit 212 in the battery monitoring device 204_*k* is coupled to the battery module 202_*k*, and is configured to monitor a status (e.g., a voltage and/or temperature) of the battery module 202_*k*.

As shown in FIG. 2A, the BMU 208 includes a controller 208_2 (e.g., a microcontroller unit (MCU), an electronic control unit (ECU), or the like) and a bridge integrated circuit (Bridge IC) 2081. The BJB 210 can include a battery junction box analog front end (BJB_AFE) 210_1, two isolators 206, and a resistive component R0. The controller 208_2 is coupled to the Bridge IC 208_1. The Bridge IC 208_1 is coupled to the BJB_AFE 210_1 via the first isolator 206 in the BJB 210. The BJB_AFE 210_1 is coupled to the battery monitoring device 204_1 via the second isolator 206 in the BJB 210 and also via another isolator 206 that is between the BJB 210 and the battery monitoring device 204_1.

In an embodiment, a serial communication link can be established between the BMU 208 and the battery monitoring devices 204_1-204_*n*. In the example of FIG. 2A, the serial communication link 211 includes the battery monitoring devices 204_1-204_*n*, the BJB_AFE 210_1, and the BMU 208. The BMU 208 can communicate with the battery monitoring devices 204_1-204_*n* and control the battery monitoring devices 204_1-204_*n* to monitor the statuses of the battery modules 202_1-202_*n* by sending preset commands through the serial communication link. In an embodiment, the serial communication link is a communication link in which multiple devices are connected in series, and information is sequentially relayed between the multiple devices, from one device to an adjacent device. Such a serial communication link can also be referred to as a daisy-chain communication link. In addition, the serial communication link can include either a linear serial communication link 211 (shown in FIG. 2A) or a looped serial communication link 213 (shown in FIG. 2B). In an embodiment, as used herein, a linear serial communication link is a communication link in which multiple devices are connected in series without forming a loop, and a looped serial communication link is a communication link in which multiple devices are connected in series and form a loop.

As shown in FIG. 2A, the BMU 208 can communicate with the battery monitoring devices 204_1-204_*n* through the linear serial communication link 211, and can send a sensing command SC to the battery monitoring devices 204_1-204_*n* through the linear serial communication link 211 to instruct the battery monitoring devices 204_1-204_*n* to monitor the statuses of the battery modules 202_1-202_*n*. The controller 2082 can generate the sensing command SC and use the Bridge IC 208_1 to send the sensing command SC to the BJB 210 and the battery monitoring devices 204_1-204_*n* through the linear serial communication link 211. The sensing command SC can be relayed sequentially to the BJB 210 and the battery monitoring devices 204_1-204_*n* (from one device to a second and adjacent/next device, from the second device to a third device adjacent/next to the second device, and so on; e.g., a daisy-chain communication link). In response to the sensing command SC, the battery monitoring devices 204_1-204_*n* can monitor the status(es) of their respective battery module and send the status information of their respective battery module to the controller 208_2 via the linear serial communication link 211 sequentially as described above. In an embodiment, the communication port 214 of each battery monitoring device of the battery monitoring devices 204_1-204_*n* is coupled to the linear serial communication link 211 and receives the sensing command SC generated and/or provided by the BMU 208 through the linear serial communication link 211.

In an embodiment, the BMU 208 can control, through the linear serial communication link 211, the BJB 210 to monitor a current $I_{BAT}$ flowing through the battery modules 202_1-202_*n*. For example, in response to a sensing command SC, the BJB_AFE 210_1 of the BJB 210 can monitor the current $I_{BAT}$ of the battery modules 202_1-202_*n* through the resistive element R0 and send information for the current $I_{BAT}$ of the battery modules 202_1-202_*n* to the controller 208_2 through the linear serial communication link 211. In addition, the BJB_AFE 210_1 can receive voltage information and/or other status information of the battery modules 202_1-202_*n* and forward that information to the BMU 208. The BJB_AFE 210_1 can also be referred to as a battery monitoring device 210_1.

In an embodiment, the isolators 206 are used to transmit and receive signals such as, for example, commands provided by the controller 208_2 and information for the statuses of the battery modules 202_1-202_*n* monitored by the battery monitoring devices 204_1-204_*n*. More specifically, the isolators 206 can allow the alternating-current (AC) component of the command signals to pass through and can block the direct-current (DC) component of the command signals. As a result, although the battery monitoring devices 204_1-204_*n* operate with different reference grounds, the isolator 206 can allow adjacently coupled battery monitoring devices to communicate with each other using the AC component of the command signals while isolating the DC component of the command signals from both sides. In an embodiment, each isolator of the isolators 206 includes a capacitor circuit, a transformer, or the like.

Figure 2B:
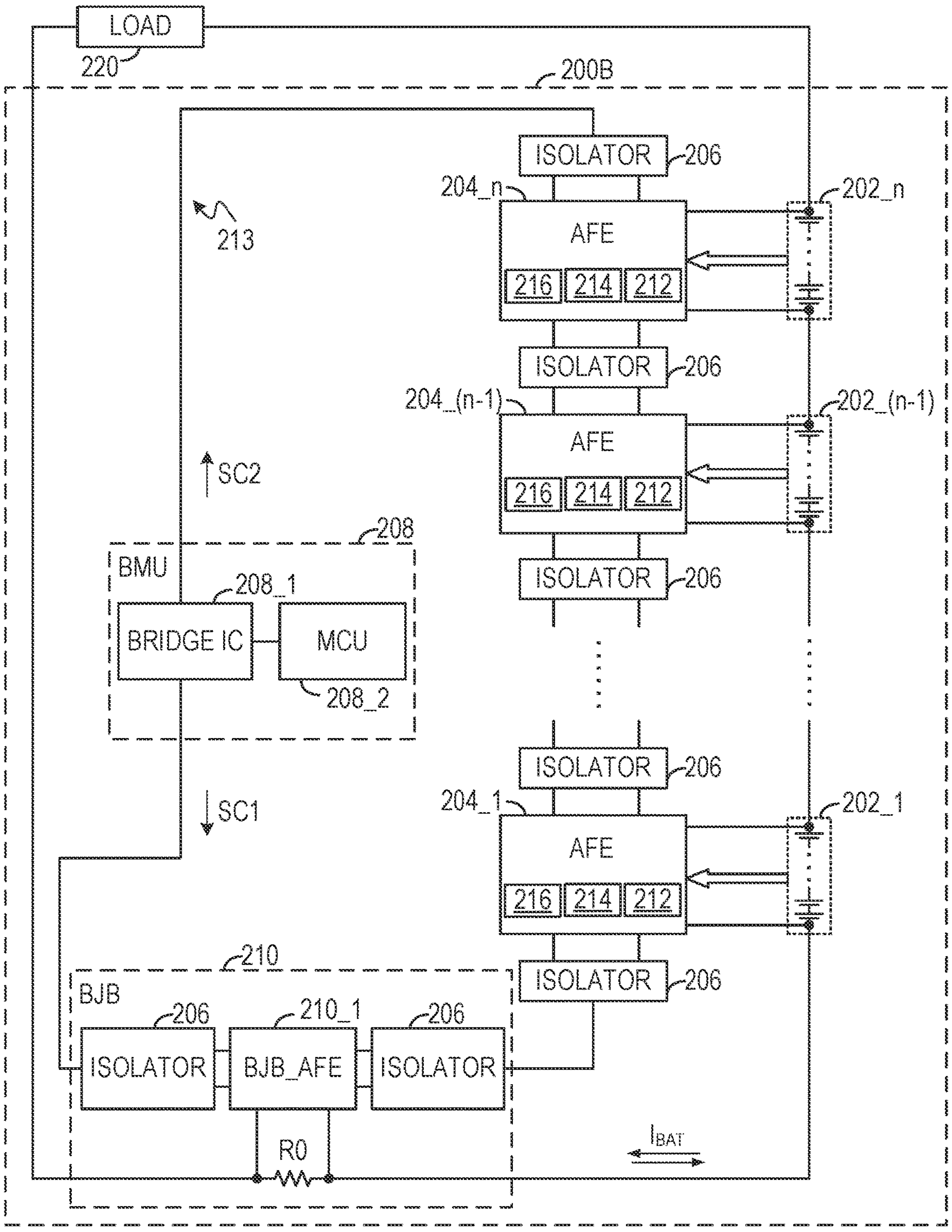
FIG. 2B illustrates a circuit diagram showing selected elements and components of an example of a battery monitoring system, in an embodiment of the present invention.

FIG. 2B illustrates a circuit diagram showing selected elements and components of an example of a battery monitoring system 200B, in another embodiment of the present invention. The battery monitoring system 200B is similar to the battery monitoring system 200A except that the Bridge IC 208_1 in the battery monitoring system 200B is coupled to the battery monitoring device 204_*n* through an isolator 206, thereby forming a loop. Thus, as shown in FIG. 2B, a looped serial communication link 213 is established between the BMU 208, the BJB 210, and the battery monitoring devices 204_1-204_*n*.

As shown in FIG. 2B, information and/or commands can flow sequentially (from one device to an adjacent device as described above) in a clockwise direction through the looped serial communication link 213 or in a counterclockwise direction through the looped serial communication link 213. In an embodiment, the looped serial communication link 213 includes an uplink and a downlink. Herein, the term "uplink" is arbitrarily assigned to the counterclockwise direction and the term "downlink" is arbitrarily assigned to the clockwise direction. Accordingly, when the information and/or commands are set to flow in the counterclockwise direction through the looped serial communication link 213, the information and/or commands are transmitted through the uplink of the looped serial communication link 213; and when the information and/or commands are set to flow in the clockwise direction through the looped serial communication link 213, the information and/or commands are transmitted through the downlink of the looped serial communication link 213.

In an embodiment, a sensing command SC generated by the controller 208_2 can be transmitted in two different (opposite) directions in the looped serial communication link 213: that is, the same command is sent both in the direction of the uplink and in the direction of the downlink. For example, the sensing command SC is represented as an uplink sensing command SC1 and a downlink sensing command SC2. The sensing command SC (uplink sensing command SC1) is transmitted through the uplink of the looped serial communication link 213. The sensing command SC (downlink sensing command SC2) is also transmitted through the downlink of the looped serial communication link 213. Specifically, the uplink sensing command SC1 is transmitted sequentially (e.g., in a daisy-chain communication link) in the order of the Bridge IC 208_1, the BJB 210, and the battery monitoring devices 204_1-204_*n*. The downlink sensing command SC2 is transmitted sequentially (e.g., as a daisy-chain communication link) in the order of the Bridge IC 208_1, the battery monitoring devices 204_*n*-204_1, and the BJB 210.

In another embodiment, the sensing command SC includes a first sensing command (e.g., an uplink sensing command SC1) and a second sensing command (e.g., a downlink sensing command SC2) that are not identical. The first sensing command SC1 can be transmitted through the uplink of the looped serial communication link 213, and the second sensing command SC2 can be transmitted through the downlink of the looped serial communication link 213. The first and second commands SC1 and SC2 can be set according to the number of devices in the uplink and the number of devices in the downlink, and according to a propagation delay of each of the devices in the looped serial communication link 213.

Thus, in an embodiment, the sensing command SC can be transmitted through the uplink and downlink of the looped serial communication link 213 in parallel. More specifically, the battery monitoring system 200B can perform a first operation and a second operation in parallel. In the first operation, the Bridge IC 208_1 can transmit the uplink sensing command SC1 to the BJB 210 and a first group of the battery monitoring devices 204_1-204_*n* through the uplink. In the second operation, the Bridge IC 208_1 can transmit the downlink sensing command SC2 to a second group of the battery monitoring devices 204_1-204_*n* (e.g., the remainder of the devices that are not in the first group) through the downlink. As a result, the total propagation delay of the sensing command SC reaching all of the battery monitoring devices 204_1-204_*n* can be reduced, and thus the time for determining battery status such as SOC and/or SOH can be reduced.

Figure 3:
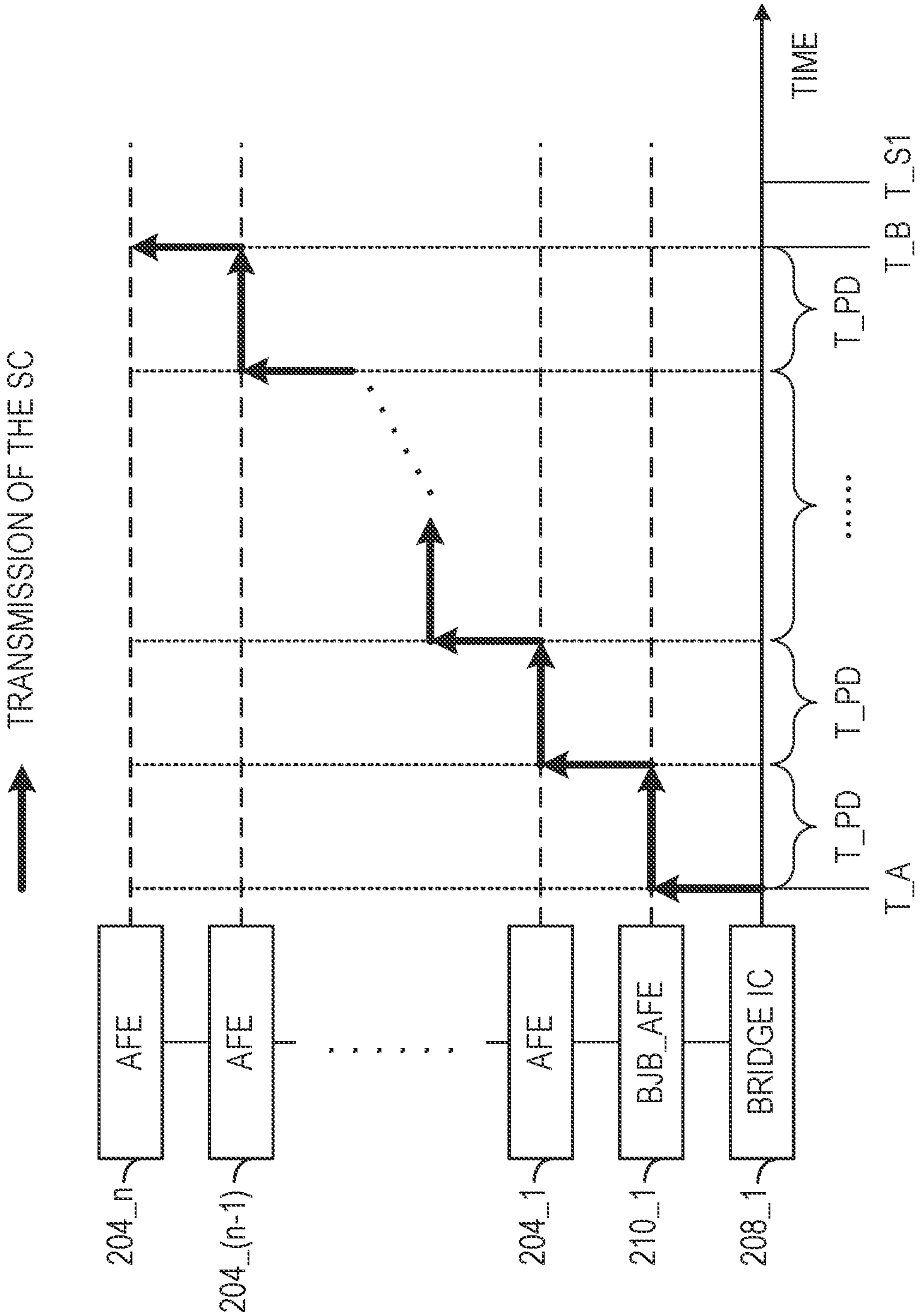
FIG. 3 illustrates a diagram of an example of a transmission process of a sensing command performed by multiple battery monitoring devices, in an embodiment of the present invention.

FIG. 3 illustrates a diagram of an example of a process of transmitting a sensing command SC in the battery monitoring devices 204_1-204_*n*, in an embodiment of the present invention. FIG. 3 is described with reference to FIG. 2A. As shown in FIG. 3, at time point T_A, the Bridge IC 208_1 sends the sensing command SC to the BJB_AFE 210_1 through the linear serial communication link 211. After the time point T_A, the sensing command SC is relayed sequentially (e.g., in a daisy-chain communication link) in the order of the BJB_AFE 210_1, the battery monitoring device 204_1, the battery monitoring devices 204_2, . . . , and the battery monitoring device 204_(n−1). In an embodiment, each battery monitoring device of the battery monitoring devices 210_1 and 204_1-204_(n−1) has a propagation delay T_PD when forwarding the sensing command SC, e.g., a propagation delay from the moment a battery monitoring device receives the sensing command SC to the moment that device transmits the sensing command SC. At time point T_B, the sensing command SC is transmitted to the last battery monitoring device 204_*n*.

As shown in FIG. 3, the starting time point of each propagation delay T_PD can represent the moment when a respective battery monitoring device receives (or executes) the sensing command SC, and the ending time point of the propagation delay T_PD can represent the moment when the next battery monitoring device adjacently coupled to the respective battery monitoring device receives (or executes) the sensing command SC. In an embodiment, the propagation delays T_PD of the battery monitoring devices 210_1 and 204_1-204_(n−1) are the same or approximately the same; however, the invention is not so limited as will be seen from the discussion further below.

Figure 4A:
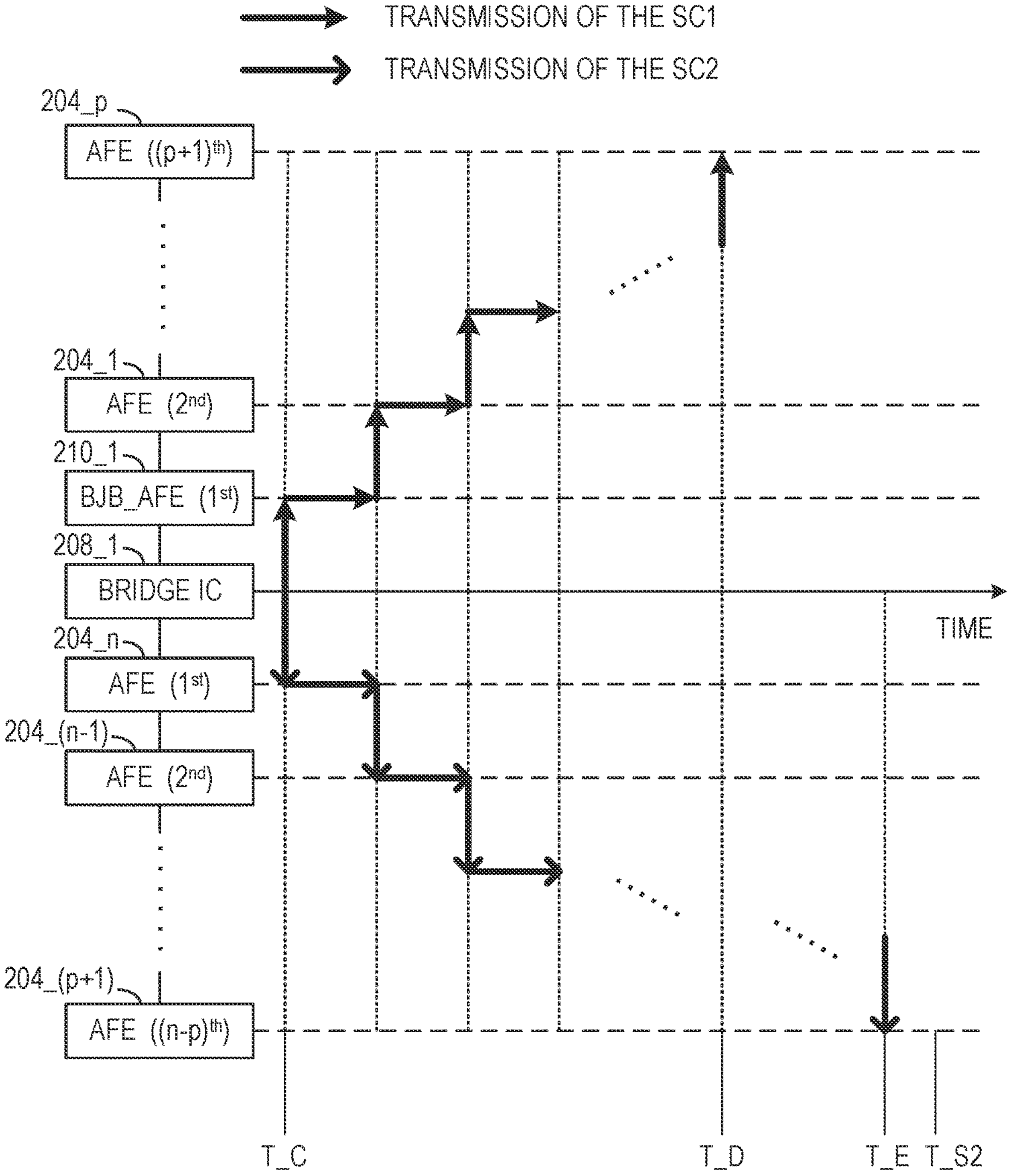
FIG. 4A illustrates a diagram of an example of a transmission process of a sensing command performed by multiple battery monitoring devices, in an embodiment of the present invention.

FIG. 4A illustrates a diagram of an example of a process of transmitting the sensing command SC in two directions (uplink sensing command SC1 and downlink sensing command SC2) in the battery monitoring devices 204_1-204_*n*, in another embodiment of the present invention. FIG. 4A is described with reference to FIG. 2B. As shown in FIG. 4A, at time point T_C, the Bridge IC 208_1 sends the uplink sensing command SC1 and the downlink sensing command SC2 to the BJB_AFE 210_1 and the battery monitoring device 204_*n*, respectively, through the looped serial communication link 213 in both the clockwise and counterclockwise directions. After the time point T_C, in the counterclockwise direction of the looped serial communication link 213, the uplink sensing command SC1 is transmitted sequentially in the order of the BJB_AFE 210_1 to the battery monitoring devices 204_1, 204_2, . . . , 204_*p* (1<p<n) in a relayed manner (e.g., a daisy-chain communication link), that is to say, the uplink sensing command SC1 is transmitted through the uplink of the looped serial communication link 213 to the aforementioned first group of devices (see the discussion of FIG. 2B). Similarly, in the clockwise direction of the looped serial communication link 213, the downlink sensing command SC2 is transmitted sequentially in the order of the battery monitoring devices 204_*n*, 204_(n−1), . . . , 204_(p+1) in a relayed manner (e.g., a daisy-chain communication link); that is to say, the downlink sensing command SC2 is transmitted through the downlink of the looped serial communication link 213 to the aforementioned second group of devices (FIG. 2B). At time point T_D, the uplink sensing command SC1 is transmitted to the battery monitoring device 204_*p* (the last device in the first group). At time point T_E, the downlink sensing command SC2 is transmitted to the battery monitoring device 204_(p+1) (the last device in the second group).

In this embodiment, the uplink sensing command SC1 and the downlink sensing command SC2 are transmitted in parallel (albeit in different directions) through the looped serial communication link 213. As a result, although each battery monitoring device has a propagation delay T_PD in forwarding the sensing command, the total propagation delay of broadcasting the sensing command to the battery monitoring devices 204_1-204_*n* can be reduced, and thus the time for determining battery status such as SOC and SOH can be reduced. Moreover, in an embodiment, the uplink sensing command SC1 can be used to instruct the battery monitoring devices 204_1-204_*p* to monitor the statuses of the battery modules 202_1-202_*p*, and the downlink sensing command SC2 can be used to instruct the battery monitoring devices 204_(p+1)-204_*n* to monitor the statuses of the battery modules 202_(p+1)-202_*n*.

In an embodiment, to further reduce the total propagation delay of the sensing command SC reaching all the battery monitoring devices 204_1-204_*n*, the value of p is set to a target number (e.g., an integer equal to or close to n/2), which makes the number of battery monitoring devices that receive the uplink sensing command SC1 equal to or just one device different from the number of battery monitoring devices that receive the downlink sensing command SC2. For example, p can be set to 5 if n=11, so that the number of battery monitoring devices (e.g., including the BJB_AFE 210_1 and the battery monitoring devices 204_1, . . . , 204_5) that receive the uplink sensing command SC1 is the same as the number of battery monitoring devices (e.g., including the battery monitoring devices 204_6, . . . , 204_11) that receive the downlink sensing command SC2. For another example, p can be set to 6 if n=12, so that the number of battery monitoring devices that receive the uplink sensing command SC1 is one more than the number of battery monitoring devices that receive the downlink sensing command SC2. For yet another example, p can be set to 5 if n=12, so that the number of battery monitoring devices that receive the uplink sensing command SC1 is one less than the number of battery monitoring devices that receive the downlink sensing command SC2. As a result, the process of receiving the uplink sensing command SC1 by the battery monitoring devices 210_1 and 204_1-204_*p* and the process of receiving the downlink sensing command SC2 by the battery monitoring devices 204_(p+1)-204_*n* can be executed in parallel as efficiently as possible, thereby further reducing the total propagation delay of the sensing command SC reaching all the battery monitoring devices 210_1 and 204_1-204_*n*.

Figure 4B:
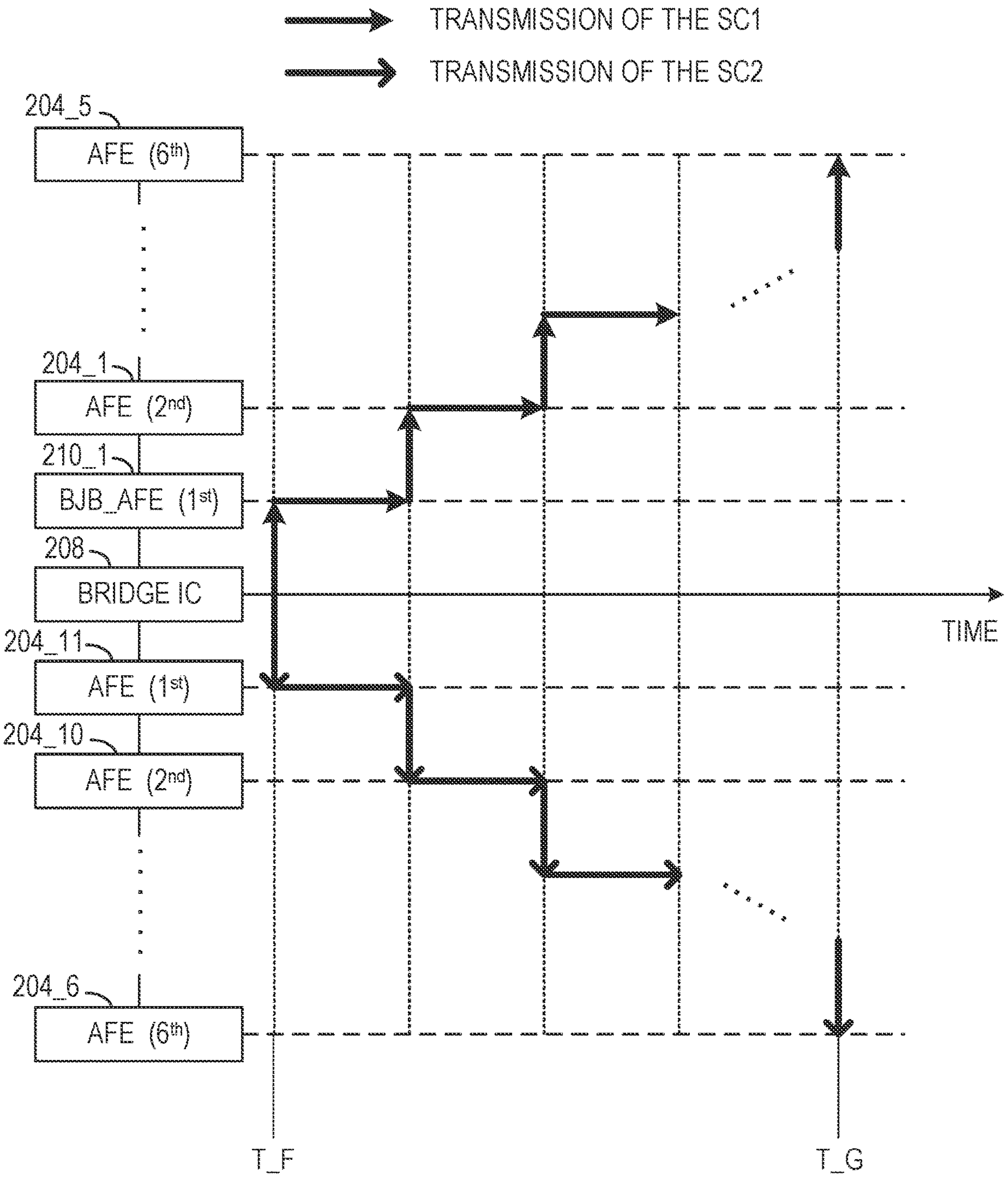
FIG. 4B illustrates a diagram of an example of a transmission process of a sensing command performed by multiple battery monitoring devices, in an embodiment of the present invention.

FIG. 4B illustrates a diagram of an example of a process of transmitting the sensing command SC in the battery monitoring devices when n=11 and p=5, in an embodiment of the present invention. FIG. 4B is illustrated in combination with FIG. 2B. As shown in FIG. 4B, at time point T_F, the Bridge IC 208_1 sends the uplink sensing command SC1 and the downlink sensing command SC2 to the BJB_AFE 210_1 and the battery monitoring device 204_11, respectively, through the looped serial communication link 213. At time point T_G, the uplink sensing command SC1 is transmitted to the battery monitoring device 204_5 and the downlink sensing command SC2 is transmitted to the battery monitoring device 204_6. Compared with the method of transmitting the sensing command SC shown in FIG. 3, the method of transmitting the sensing command SC shown in FIG. 4B can reduce the total propagation delay of the sensing command SC by half.

As mentioned in relation to FIGS. 2A and/or 2B, each of the battery monitoring devices **204_1-204_*n* can include a control circuit 216, a monitoring circuit 212, and a communication port 214. The control circuit 216 can be coupled to the monitoring circuit 212 and the communication port 214. In each of the battery monitoring devices 204_1-204_*n*, the respective control circuit 216 can control the respective monitoring circuit 212 to monitor a status of the respective battery module. In an embodiment, as described further below, the battery monitoring devices 204_1-204_*n* can start monitoring the statuses of battery modules 202_1-202_*n* at or approximately at the same time according to the sensing command SC provided by the BMU 208. After obtaining the status information of the battery modules 202_1-202_*n*, the battery monitoring devices 204_1-204_*n* can send the status information of the battery modules 202_1-202_*n* to the BMU 208 through the serial communication link (e.g., including the linear serial communication link 211 or the looped serial communication link 213). Because the battery monitoring devices 204_1-204_*n* of the serial communication link 211 or 213 can sense the battery modules 202_1-202_*n* synchronously, the accuracy of determining the SOC and SOH of the battery modules 202_1-202_*n*** is improved.

Specifically, as shown in FIG. 2A, in the $i^{th}$ battery monitoring device **204_*i* (i=1, 2, . . . , n) of the battery monitoring devices 204_1-204_*n* for example, the control circuit 216 can start a preset time delay PRE_DLYi when the control circuit 216 executes the sensing command SC, and can control the monitoring circuit 212 to sense the status of the respective battery module (i.e., the $i^{th}$ battery module 202_*i* of the battery modules 202_1-202_*n*) at a sensing time point when the preset time delay PRE_DLYi expires. As described further below, the lengths of the preset time delays PRE_DLY1, PRE_DLY2, . . . , PRE_DLYn (which may be referred to collectively as PRE_DLYs) for the battery monitoring devices 204_1-204_*n* correspond to the length of the propagation delay T_PD associated with receiving or executing the sensing command SC (or SC1 or SC2) at each battery monitoring device and the position of a battery monitoring device in the serial communication link 211. (Herein, "position" refers to the location in the serial communication link of the battery monitoring device 204_*i* relative to the other battery monitoring devices in the serial communication link: if the battery monitoring device 204_*i* is, for example, the third device in the serial communication link, then it is in position 3.) By compensating for the propagation delay at each of the battery monitoring devices 204_1-204_*n* in this manner, the sensing time points of the battery modules 202_1-202_*n*** are synchronized so that each battery monitoring device senses a status of its respective battery module at or approximately at the same time.

In an embodiment, the preset time delays PRE_DLYs for the battery monitoring devices **204_1-204_*n* are configurable. The preset time delays PRE_DLYs for the battery monitoring devices 204_1-204_*n* can be configured such that each of the battery monitoring devices start monitoring the statuses of the battery modules 202_1-202_*n* at or approximately at the same time. The configuration of the preset time delays PRE_DLYs will be described below with reference to FIG. 3**.

In an embodiment, the battery monitoring devices **204_1-204_*n* sense the status(es) of their respective battery module synchronously at the time point T_B shown in FIG. 3. For example, the first preset time delay PRE_DLY1 corresponding to the battery monitoring device 204_1** can be configured to be P_DLY*(n−1), the second preset time delay PRE_DLY2 corresponding to the battery monitoring device 204_2 can be configured to be P_DLY*(n−2), . . . , and the $n^{th}$ preset time delay PRE_DLYn corresponding to the battery monitoring device **204_*n* can be configured to be zero. In this embodiment, P_DLY is a preset time period and represents the propagation delay T_PD of each of the battery monitoring devices. Specifically, P_DLY can be configured to be equal or approximately equal to the propagation delay T_PD. In an embodiment, the $i^{th}$ preset time delay PRE_DLYi of the battery monitoring device 204_*i*** is determined according to the following equation:

$$\text{PRE\_DLYi} = (n - i) * \text{P\_DLY}. \tag{1}$$

In equation (1), PRE_DLYi represents the preset time delay of the battery monitoring device **204_*i*, n represents the total number of the battery monitoring devices 204_1-204_*n* in the linear serial communication link 211, P_DLY is equal to or approximately equal to T_PD, and i is an integer representing the position of the battery monitoring device 204_*i* in the linear serial communication link 211. For example, if the battery monitoring device 204_*i* is the first device in the serial communication link 211 (next to the BJB 210), then i=1; and if the battery monitoring device 204_*i* is, for example, the third device in the serial communication link 211, then i=3. In an embodiment, by presetting the time delays PRE_DLY1, PRE_DLY2, . . . , PRE_DLYn for the battery monitoring devices 204_1-204_*n*, respectively, according to equation (1), the battery monitoring devices 204_1-204_*n*** can sense the status(es) of their respective battery module synchronously (at or approximately at the same time, e.g., at the time point T_B). The phrase "at or approximately at the same time" means that a time difference may exist between the time when a first battery monitoring device senses a status of a first battery module and the time when a second battery monitoring device senses a status of a second battery module (e.g., due to non-ideality of circuit components in the battery monitoring system) and the time difference is negligibly small.

In an embodiment, the time delay PRE_DLYn of the battery monitoring device **204_*n* is preset to be zero, and therefore the battery monitoring devices 204_1-204_*n* synchronously sense the battery statuses at the time point T_B. However, the invention is not so limited. In another embodiment, the time delay PRE_DLYn may be set to Δt1 (e.g., a relatively short time interval), and therefore the battery monitoring devices 204_1-204_*n* synchronously sense the battery statuses at the time point T_B+Δt1 (e.g., the time point T_S1 shown in FIG. 3). More specifically, the first preset time delay PRE_DLY1** can be configured to be P_DLY*(n−1)+Δt1, the second preset time delay PRE_DLY2 can be configured to be P_DLY*(n−2)+Δt1, . . . , and the $n^{th}$ preset time delay PRE_DLYn can be configured to be Δt1. The time interval Δt1 represents a difference between the time point T_B and the time point T_S1. The time interval Δt1 can be configured, and Δt1≥0. In an embodiment, the $i^{th}$ preset time delay PRE_DLYi is determined according to the following equation:

$$\text{PRE\_DLYi} = (n - i) * \text{P\_DLY} + \Delta t1. \tag{2}$$

In equation (2), PRE_DLYi represents the preset time delay of the battery monitoring device 204_*i*, n represents the total number of the battery monitoring devices 204_1-204_*n* in the linear serial communication link 211, P_DLY is equal to or approximately equal to T_PD, and i is an integer representing the position of the battery monitoring device 204_*i* in the linear serial communication link 211. In an embodiment, by presetting the time delays PRE_DLY1, PRE_DLY2, . . . , PRE_DLYn for the battery monitoring devices 204_1-204_*n*, respectively, according to equation (2), the battery monitoring devices 204_1-204_*n* can sense the status(es), e.g., voltage, of their respective battery module synchronously, e.g., at time point T_S1.

Furthermore, in an embodiment, the BJB_AFE 210_1 also includes a control circuit that starts a preset time delay PRE_DLY0 when executing the sensing command SC and controls a monitoring circuit to sense a status, e.g., a current $I_{BAT}$, of the whole battery pack (including the batteries modules 202_1-202_*n*) when the time delay PRE_DLY0 expires. The time delay PRE_DLY0 can be set such that the BJB_AFE 210_1 senses the battery current $I_{BAT}$ of the battery pack when the battery monitoring devices 204_1-204_*n* sense the statuses, e.g., voltages, of the battery modules 202_1-202_*n*. Thus, the current and voltages of the battery modules 202_1-202_*n* can be sensed synchronously.

For example, if a propagation delay T_PD0 of the BJB_AFE 2101 is equal to or approximately equal to the propagation delay T_PD of the battery monitoring devices 204_1-204_*n*, and the preset time delays PRE_DLYs of the battery monitoring devices 204_1-204_*n* are set according to equation (1), then the preset time delay PRE_DLY0 of the BJB_AFE 210_1 can be set to be equal to n*P_DLY. Similarly, if the propagation delay T_PD0 of the BJB_AFE 210_1 is equal to or approximately equal to the propagation delay T_PD of the battery monitoring devices 204_1-204_*n*, and the preset time delays PRE_DLYs of the battery monitoring devices 204_1-204_*n* are set according to equation (2), then the preset time delay PRE_DLY0 of the BJB_AFE 210_1 can be set to be equal to n*P_DLY+Δt1. In other embodiments, if a propagation delay T_PD0 of the BJB_AFE 2101 is very different from the propagation delay T_PD of the battery monitoring devices 204_1-204_*n*, then the preset time delay PRE_DLY0 of the BJB_AFE 210_1 can be set to be equal to T_PD0+(n−1)*P_DLY or to T_PD0+(n−1)*P_DLY+Δt1.

As mentioned above, in the examples of FIG. 2A and FIG. 3, the $i^{th}$ preset time delay PRE_DLYi of the battery monitoring device 204_*i* can be determined according to equation (1) or equation (2), and the number "n" represents the total number of selected devices (e.g., the battery monitoring devices 204_1-204_*n*) in the linear serial communication link 211. Similarly, in an embodiment, equation (1) or equation (2) can be applied to the uplink 211 in FIG. 2B (e.g., including the BJB_AFE 210_1 and the AFEs 204_1-204_*p* shown in FIG. 4A), in which case the number "n" in equation (1) or equation (2) represents the total number "p+1" of the devices 210_1 and 204_1-204_*p* in the uplink 211. Similarly, equation (1) or equation (2) can be applied to the downlink 213 in FIG. 2B (e.g., including the AFEs 204_*n*-204_(p+1) shown in FIG. 4A), in which case the number "n" in equation (1) or equation (2) represents the total number "n−p" of the devices 204_*n*−204_(p+1) in the downlink 213.

With reference now to the embodiment of FIG. 2B, and as shown in FIG. 4A, the time point T_D can represent the time when the battery monitoring device 204_*p* receives or executes the uplink sensing command SC1, and the time point T_E can represent the time when the battery monitoring device 204_(p+1) receives or executes the downlink sensing command SC2. To illustrate, consider an example in which the battery monitoring devices 210_1 and 204_1-204_*n* start monitoring statuses of the battery modules 202_1-202_*n* synchronously at time point T_S2. The uplink of the looped serial communication link 213 includes the battery monitoring devices 210_1 and 204_1-204_*p*. The battery monitoring device 210_1 can be considered as the first battery monitoring device in the uplink of the looped serial communication link 213, the battery monitoring device 204_1 can be considered as the second battery monitoring device in the uplink of the looped serial communication link 213, . . . , and the battery monitoring device 204_*p* can be considered as the $(p+1)^{th}$ battery monitoring device in the uplink of the looped serial communication link 213.

Equation (2) is still applicable if modified so that the time delay PRE_DLY0 of the battery monitoring device 210_1 is configured to be p*P_DLY+Δt2, the time delay PRE_DLY1 of the battery monitoring device 204_1 is configured to be (p−1)*P_DLY+Δt2, . . . , and the time delay PRE_DLYp of the battery monitoring device 204_*p* is configured to be Δt2. Δt2 can represent the difference between the time point T_D and the time point T_S2 (FIG. 4A).

Similarly, the downlink of the looped serial communication link 213 includes the battery monitoring devices 204_(p+1)-204_*n*. The battery monitoring device 204_*n* can be considered as the first battery monitoring device in the downlink of the looped serial communication link 213, the battery monitoring device 204_(n−1) can be considered as the second battery monitoring device in the downlink of the looped serial communication link 213, . . . , and the battery monitoring device 204_(p+1) can be considered as the $(n-p)^{th}$ battery monitoring device in the downlink of the looped serial communication link 213. Again, equation (2) is still applicable if the time delay PRE_DLYn of the battery monitoring device 210_*n* is configured to be (n−p−1)*P_DLY+Δt3, the time delay PRE_DLY(n−1) of the battery monitoring device 204_(n−1) is configured to be (n−p−2)*P_DLY+Δt3, . . . , and the time delay PRE_DLY(p+1) of the battery monitoring device 204_(p+1) is configured to be Δt3. Δt3 can represent the difference between the time point T_E and the time point T_S2 (FIG. 4A). In an embodiment, Δt2 and Δt3 are configurable. Δt2 and Δt3 can each represent a time interval equal to or greater than zero.

The setting of the value of p can cause the time point T_D and the time point T_E to be sequenced differently on the time axis. Specifically, if p+1<n−p, then the time point T_D precedes the time point T_E (as shown in FIG. 4A); if p+1>n−p, then the time point T_D follows the time point T_E (not shown in FIG. 4A); and if p+1=n−p, then the time point T_D and the time point T_E are in the same position on the time axis (as shown in FIG. 4B). In an embodiment, if the time point T_D precedes the time point T_E, then Δt2>Δt3≥0; if the time point T_D follows the time point T_E, then Δt3>Δt2≥0; and if the time point T_D and the time point T_E are in the same position on the time axis, then Δt3=Δt2≥0. In an embodiment, by presetting the time delays PRE_DLY0-PRE_DLYn for the battery monitoring devices 210_1 and 204_1-204_*p*, respectively, according to equation (2) as described above, the battery monitoring devices 210_1 and 204_1-204_*p* can start monitoring statuses of the battery modules synchronously, e.g., at the time point T_S2.

According to the above embodiments the preset time delay PRE_DLYi of a battery monitoring device 204_*i* can be determined according to the position of that battery monitoring device 204_*i* in a serial communication link (e.g., the linear serial communication link 211, the uplink of the looped serial communication link 213, or the downlink of the looped serial communication link 213), and the propagation delay T_PD of the battery monitoring device 204_*i*.

As mentioned above, each of the battery modules 202_1-202_*n* (hereinafter, battery module 202) can include multiple battery cells, and a respective battery monitoring device (hereinafter, battery monitoring device 204) of the devices 204_1-204_*n* can monitor statuses of the battery cells. In an embodiment, the monitoring circuit 212 of the battery monitoring device 204 can perform a first sensing operation on each battery cell of the multiple battery cells at a first time point to obtain first sensing data and perform a second sensing operation on each battery cell at a second time point to obtain second sensing data. The monitoring circuit 212 can further generate information indicating the status of the battery module 202 according to the first sensing data and the second sensing data. The control circuit 216 of the battery monitoring device 204 can further control the communication port 214 to send information indicating the status of the battery module 202 to the BMU 208 via the serial communication link (e.g., including the linear serial communication link 211 or the looped serial communication link 213). This embodiment will be illustrated below in combination with FIG. 5.

Figure 5:
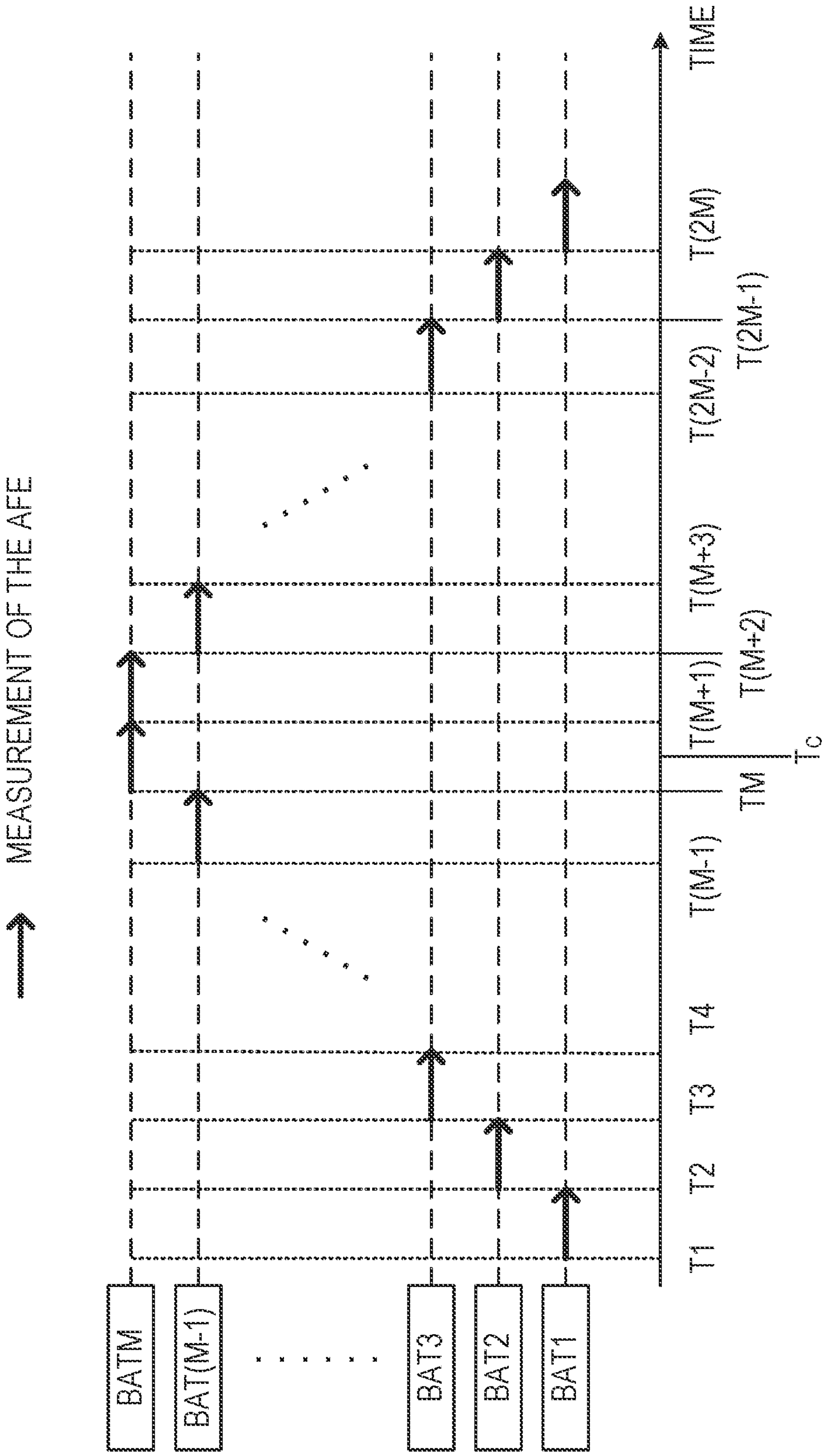
FIG. 5 illustrates a diagram of an example of a monitoring process of multiple battery cells performed by a battery monitoring device, in an embodiment of the present invention.

FIG. 5 illustrates a diagram of an example of a battery monitoring device 204 monitoring multiple battery cells BAT1-BATM (M=2, 3, . . . ) in a battery module 202, in an embodiment of the present invention. As shown in FIG. 5, the monitoring circuit 212 of the battery monitoring device 204 can sense statuses of the battery cells BAT1-BATM sequentially in a first order in a first set of time frames and can sense the statuses of the battery cells BAT1-BATM sequentially in a second order (where the second order is the reverse of the first order) in a second set of time frames following the first set of time frames. In each time frame of the first and second sets of time frames, the monitoring circuit 212 monitors a status of a respective battery cell of the battery cells BAT1-BATM, and the monitoring circuit 212 can set the first and second sets of time frames to have the same duration. Specifically, the monitoring circuit 212 can perform a first sensing operation (e.g., to sense a battery cell's voltage) in a time frame beginning at time point T1 on the first battery cell BAT1 to obtain first sensing data (e.g., including a first sensed voltage) (the first operation is indicated by the arrow beginning at time point T1), and can also perform a second sensing operation (e.g., to sense the battery cell's voltage) in a time frame beginning at time point T(2M) on the first battery cell BAT1 to obtain second sensing data (e.g., including a second sensed voltage) (the second operation is indicated by the arrow beginning at time point T(2M)). Similarly, the monitoring circuit 212 can perform: a first sensing operation in a time frame beginning at time point T2 and a second sensing operation in a time frame beginning at time point T(2M−1) on the second battery cell BAT2 to obtain, respectively, first sensing data and second sensing data, . . . , and a first sensing operation in a time frame beginning at time point TM and a second sensing operation in a time frame beginning at time point T(M+1) on the $M^{th}$ battery cell BATM to obtain, respectively, first sensing data and second sensing data.

In an embodiment, the time interval between the time point T1 and the time point T(2M) includes a middle time point, e.g., (T1+T(2M)/2, which can be referred to as the central or middle sensing time point of the first battery cell BAT1. The central or middle sensing time point of the first battery cell BAT1 can be represented by $T_C$ in FIG. 5. Similarly, the middle sensing time point of the second battery cell BAT2 is time point (T2+T(2M−1))/2, also represented by $T_C$; the middle sensing time point of the third battery cell BAT3 is time point (T3+T(2M−2))/2, also represented by $T_C$; . . . ; and the middle sensing time point of the $M^{th}$ battery cell BATM is time point (TM+T(M+1))/2, also represented by $T_C$. Thus, the time point (T1+T(2M))/2, the time point (T2+T(2M−1))/2, . . . , and the time point (TM+T(M+1)/2 coincide with each other, e.g., are the same or approximately the same: there may be a difference between each of these middle sensing time points because of, e.g., non-ideality of circuit components, but that difference is relatively small and can be ignored.

The first sensing data of the battery cell BATj (j=1, 2, . . . , M) can include the first sensed voltage of the battery cell BATj monitored at the time point Tj, and the second sensing data of the battery cell BATj can include a second sensed voltage of the battery cell BATj monitored at the time point T(2M+1−j). In a relatively stable situation (e.g., when a charging current or a discharging current of the battery module 202 is relatively stable or unchanged), an average value of the first sensed voltage and the second sensed voltage of a battery cell BATj in the battery module 202 can represent a voltage of the battery cell BATj at the central time point $T_C$. The battery monitoring device 204 can calculate an average value of the first sensed voltage and the second sensed voltage of each of the battery cells BAT1-BATM. The calculated average values can represent the voltages of the battery cells BAT1-BATM at the central time point $T_C$. Thus, the voltages of the battery cells BAT1-BATM can be considered to be synchronously sensed at the central time point $T_C$. As a result, the accuracy of monitoring the statuses of the battery cells BAT1-BATM can be further improved.

In the embodiment of FIG. 5, the monitoring circuit 212 of the battery monitoring device 204 can include one analog-to-digital converter (ADC) that monitors statuses of all the battery cells in the battery module 202. However, the invention is not so limited. In another embodiment, the monitoring circuit 212 of the battery monitoring device 204 can include multiple ADCs, and the battery cells in the battery module 202 can be divided into multiple groups (or multiple portions). Each ADC of the ADCs can perform the abovementioned first sensing operation and second sensing operation on each battery cell in a respective group of battery cells. The multiple ADCs can monitor statuses of the groups of battery cells in parallel to expedite the monitoring process. An example is illustrated below in combination with FIG. 6.

Figure 6:
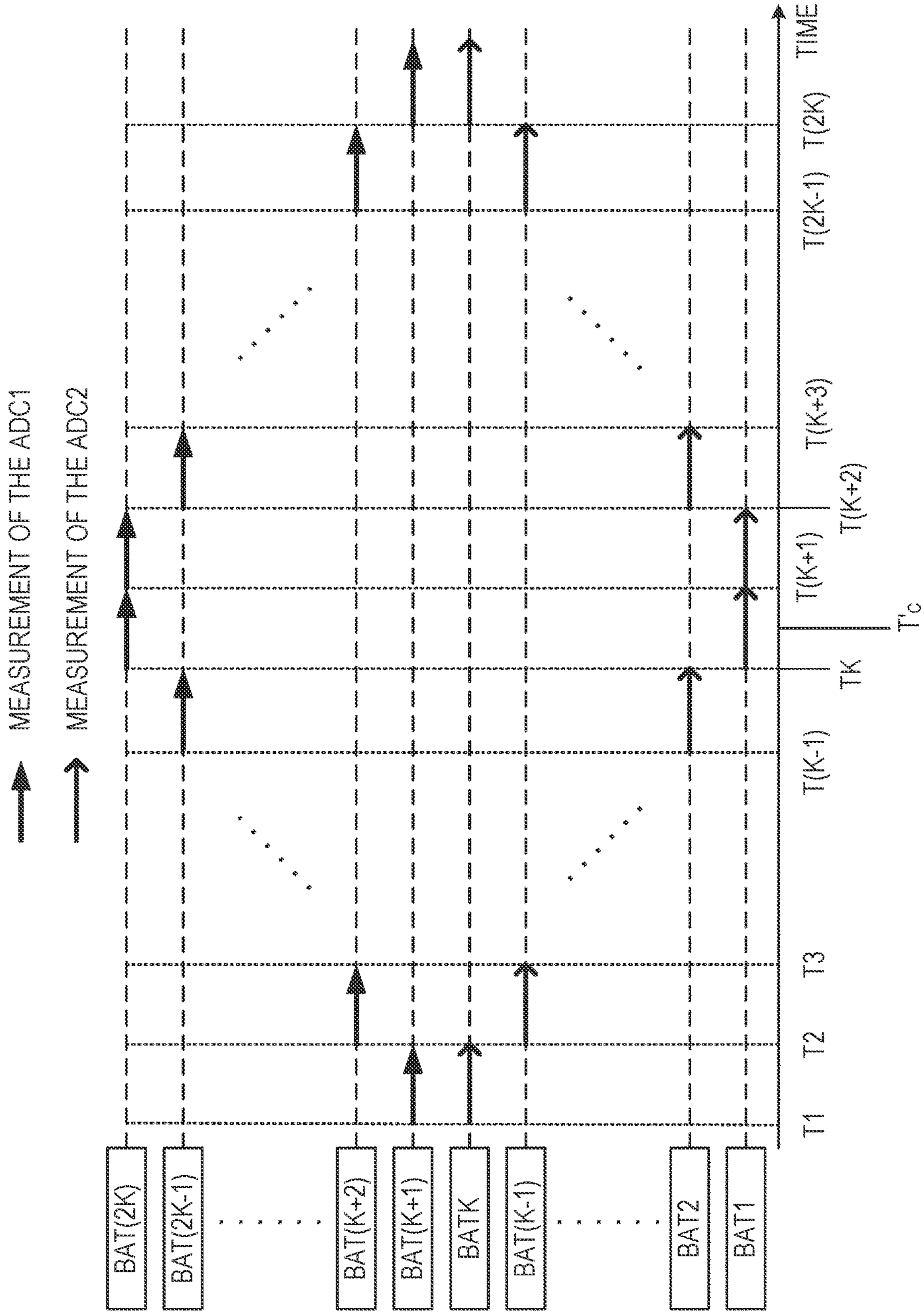
FIG. 6 illustrates a diagram of an example of a monitoring process of multiple battery cells performed by a battery monitoring device, in an embodiment of the present invention.

FIG. 6 illustrates a diagram of an example of a battery monitoring device 204 monitoring multiple battery cells BAT1-BAT(2K) (K=1, 2, 3, . . . ) in a battery module, in an embodiment of the present invention. In the example of FIG. 6, the monitoring circuit 212 of the battery monitoring device 204 includes two ADCs (ADC1 and ADC2). As shown in FIG. 6, the ADC1 can perform: a first sensing operation in a time frame beginning at time point T1 and a second sensing operation in a time frame beginning at time point T(2K) on the $(K+1)^{th}$ battery cell BAT(K+1), a first sensing operation in a time frame beginning at time point T2 and a second sensing operation in a time frame beginning at time point T(2K−1) on the $(K+2)^{th}$ battery cell BAT (K+2), . . . , and a first sensing operation in a time frame beginning at time point TK and a second sensing operation in a time frame beginning at time point T(K+1) on the $2K^{th}$ battery cell BAT(2K). The ADC2 can perform: a first sensing operation in a time frame beginning at time point T1 and a second sensing operation in a time frame beginning at time point T(2K) on the $K^{th}$ battery cell BATK, a first sensing operation in a time frame beginning at time point T2 and a second sensing operation in a time frame beginning at time point T(2K−1) on the $(K-1)^{th}$ battery cell BAT (K−1), . . . , and a first sensing operation in a time frame beginning at time point T(K) and a second sensing operation in a time frame beginning at time point T(K+1) on first battery cell BAT1. In this example, similar to the embodiment shown in FIG. 5, the middle sensing time point of each battery cell of the battery cells BAT1-BAT(2K) can be presented by the time point $T'_C$. That is, the battery monitoring device 204 can be considered to monitor the battery cells BAT1-BAT(2K) synchronously at the time point $T'_C$.

FIG. 5 and FIG. 6 describe embodiments in which the ADC or ADCs perform two sensing operations on the battery cells in time frame of the monitoring process. However, the invention is not so limited. In another embodiment, the battery module can include M battery cells (M=2, 3, . . . ) and M ADCs. In each time frame of the monitoring process, the ADCs can perform sensing operations on the battery cells in parallel to minimize the time for the sensing process. The ADCs can perform the sensing operations on the battery cells once in each time frame of the monitoring process.

Figure 7:
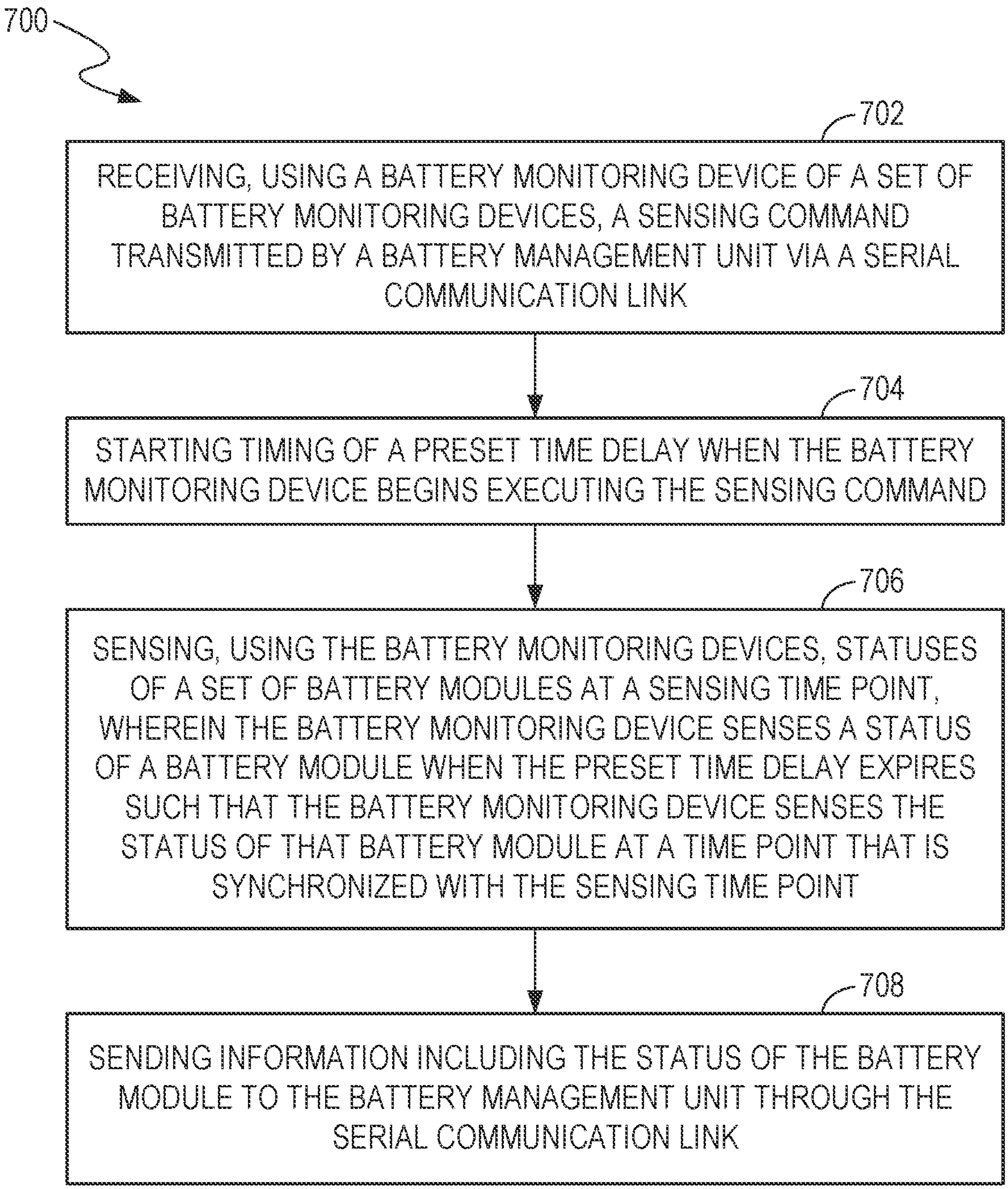
FIG. 7 illustrates a flowchart of an example of a method for monitoring multiple battery modules, in an embodiment of the present invention.

FIG. 7 illustrates a flowchart 700 of an example of a method for monitoring multiple battery modules (e.g., 202_1-202_*n*), in an embodiment of the present invention. Although specific steps are disclosed in FIG. 7, such steps are examples for illustrative purposes. That is to say, embodiments according to the present invention are well suited to performing various other steps or variations of the steps recited in FIG. 7. FIG. 7 is described in combination with FIG. 2A, FIG. 2B, FIG. 3, FIG. 4A, FIG. 4B, FIG. 5, and FIG. 6.

At step 702, a battery monitoring device 204_*i* (i=1, 2, . . . , n) of a set of battery monitoring devices 204_1-204_*n* receives a sensing command SC transmitted by a battery management unit 208 via a serial communication link (e.g., 211 or 213). The serial communication link includes the battery monitoring devices 204_1-204_*n*.

At step 704, the battery monitoring device 204_*i* starts the timing of a preset time delay PRE_DLY when the battery monitoring device 204_*i* begins executing the sensing command SC.

At step 706, the battery monitoring devices 204_1-204_*n* sense statuses of the battery modules 202_1-202_*n* at a sensing time point. More specifically, the battery monitoring device 204_*i* senses a status of the battery module 202_*i* when the preset time delay PRE_DLY expires such that the battery monitoring device 204_*i* senses the status of the battery module 202_*i* at a time point that is synchronized with the abovementioned sensing time point.

At step 708, the battery monitoring device 204_*i* sends information including the status of the battery module 202_*i* to the battery management unit 208 through the serial communication link.

Accordingly, embodiments according to the present invention provide battery monitoring systems. In an embodiment, the battery monitoring system includes multiple monitoring devices capable of synchronously sensing statuses of battery modules by setting time delays for the start time points of their sensing processes. Thus, the accuracy of determining statuses such as the state-of-charge (SOC) and the state-of-health (SOH) of the battery modules can be improved. In an embodiment, the monitoring device (or each of the monitoring devices) can further sense a voltage of each cell of battery cells in a battery module twice during a preset period to obtain two voltages and can calculate an average value of the two voltages. As such, the monitoring device can provide a set of average values representing a set of cell voltages of the battery cells measured synchronously at a time point (e.g., the abovementioned middle time point $T_C$ or $T'_C$). This can further improve the accuracy of determining the SOC and SOH of the battery modules.

Additionally, in an embodiment, the BMU 208 can periodically send a sensing command SC to the battery modules to acquire/obtain multiple sets of data over multiple cycles or time frames, and each set of the data is acquired/obtained in a respective cycle/time frame of these multiple cycles/time frames. The BMU 208 can analyze the multiple sets of data, based on electrochemical impedance spectroscopy (EIS) and a fast Fourier transform (FFT), to generate impedance spectrums. The impedance spectrums of the battery modules can be used to determine or estimate the SOC and SOH of the battery modules. The impedance spectrums of the battery modules may also be used to estimate the internal temperature of each of the battery modules to further improve the accuracy of determining the SOC of the battery modules.

In an embodiment, the EIS provides a technique of transforming a resistance timing diagram (e.g., a time-domain graph) to an impedance spectrum (e.g., a frequency-domain graph). In an embodiment, the FFT technology provides a methodology of performing the transformation.

In an embodiment, as mentioned above, the current and voltages of the battery modules 202_1-202_*n* can be sensed synchronously, and they can be sensed periodically. The BMU 208 can acquire/obtain a current value $I_{BATA}$ and voltage values $V1_A$, $V2_A$, . . . , and $Vn_A$ (hereinafter, a first dataset) of the battery modules 202_1-202_*n* that are measured synchronously in a first cycle/time frame, and acquire/obtain a current value $I_{BATB}$ and voltage values $V1_B$, $V2_B$, . . . , $Vn_B$ (hereinafter, a second dataset) of the battery modules 202_1-202_*n* that are measured synchronously in a second cycle/time frame after the first cycle/time frame. The BMU 208 can estimate internal resistances of the battery modules 202_1-202_*n* based on the first and second datasets.

By way of example, the battery module 202_1 includes multiple battery cells and an internal resistance R1. Thus, in the first cycle or time frame, the voltage $V1_A$ of the battery module 202_1 can be given by: $V1_A=V_{CELLSA}+I_{BATA}*R1$, where $V_{CELLSA}$ represents the total voltage of the battery cells in the battery module 202_1. In the second cycle or time frame, the voltage $V1_B$ of the battery module 202_1 can be given by: $V1_B=V_{CELLSB}+I_{BATB}*R1$, where $V_{CELLSB}$ represents the total voltage of the battery cells in the battery module 202_1. In an embodiment, the time gap between the first and second cycles (or time frames) is relatively short, and therefore the battery cells' total voltage is relatively stable, e.g., $V_{CELLSB}=V_{CELLSA}$. Accordingly, the internal resistance R1 of the battery module 202_1 can be calculated as follows: $R1=(V1_B-V1_A)/(I_{BATB}-I_{BATA})$. Similarly, the internal resistances R2, R3, . . . , Rn of the battery modules 202_2-202_*n* can be calculated as follows: $R2=(V2_B-V2_A)/(I_{BATB}-I_{BATA})$, $R3=(V3_B-V3_A)/(I_{BATB}-I_{BATA})$, . . . , $Rn=(Vn_B-Vn_A)/(I_{BATB}-I_{BATA})$.

Accordingly, the BMU 208 can measure the battery current $I_{BAT}$ and the battery voltages V1, V2, . . . , and Vn of the battery modules 202_1-202_*n* periodically such that the BMU 208 can calculate/obtain multiple values of the internal resistance of the battery module 202_1, multiple values of the internal resistance of the battery module 202_2, . . . , and multiple values of the internal resistance of the battery module 202_*n*. The BMU 208 can further apply the fast Fourier transform to the multiple values of the internal resistance to generate an impedance spectrum of each of the battery modules 202_1-202_*n*. In an embodiment, an impedance spectrum of a battery module can have a particular pattern in a particular situation. For example, when the battery module is in an idle state (or in a sleep mode), the impedance spectrum of the battery module may include a first pattern. When the battery module is in a fast-charging mode, the impedance spectrum of the battery module may include a second pattern. When the battery module is switching from a sleep mode to an active mode, the impedance spectrum of the battery module may include a third pattern. As a result, the BMU 208 can determine whether a battery module is in a healthy state by analyzing a real-time impedance spectrum of the battery module. Moreover, in an embodiment, information in an impedance spectrum of a battery module may indicate the internal temperature and/or an SOC of the battery module. Accordingly, the BMU 208 may improve the estimation of the SOC of the battery module based on the real-time impedance spectrum. Detailed explanations will be provided in combination with FIG. 8 and FIG. 9 as follows.

According to the Fourier theorem, any periodic function can be represented as a sum of sinusoidal functions (sines and cosines) with different frequencies, amplitudes, and phase shifts. Non-periodic functions can also be represented by a series of sinusoidal components using the fast Fourier transform.

Figure 8:
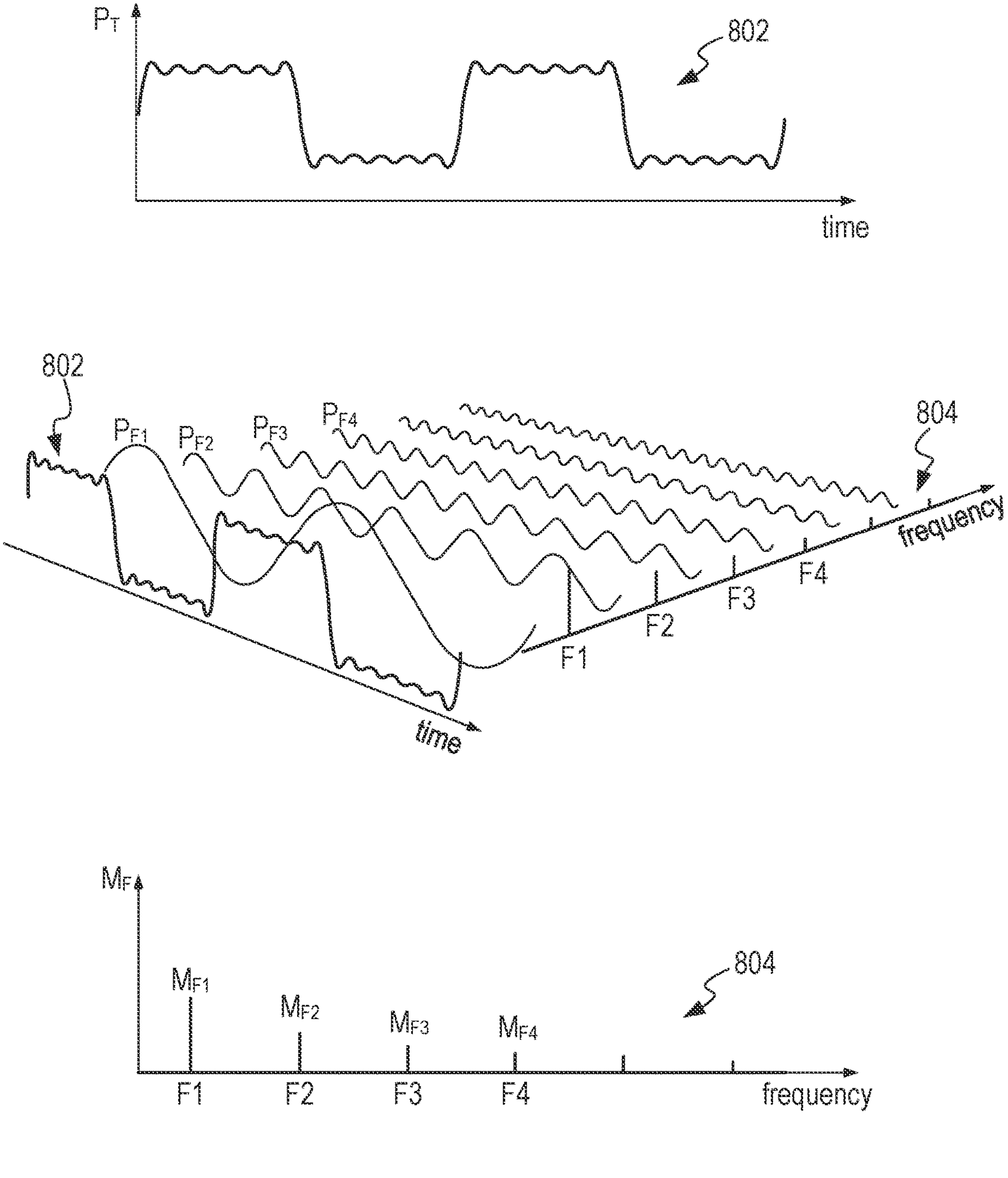
FIG. 8 PRIOR ART
FIG. 8 illustrates an example of a diagram explaining a fast Fourier transform.

FIG. 8 illustrates an example of a diagram explaining the fast Fourier transform. FIG. 8 shows a plot 802 for a value of a parameter $P_T$ over time. The relationship between the parameter $P_T$ and time can be presented by a function: $P_T=f(t)$. The function $P_T=f(t)$ can be represented by a series of sinusoidal components $P_{F1}$, $P_{F2}$, $P_{F3}$, etc., with different frequencies F1, F2, F3, etc., and different amplitudes $A_{F1}$, $A_{F2}$, $A_{F3}$, etc., shown in FIG. 8. By applying the fast Fourier transform to the parameter $P_T$, a frequency-domain graph 804 for the parameter $P_T$, with the information for the sinusoidal components $P_{F1}$, $P_{F2}$, $P_{F3}$, etc., can be generated.

Figure 9:
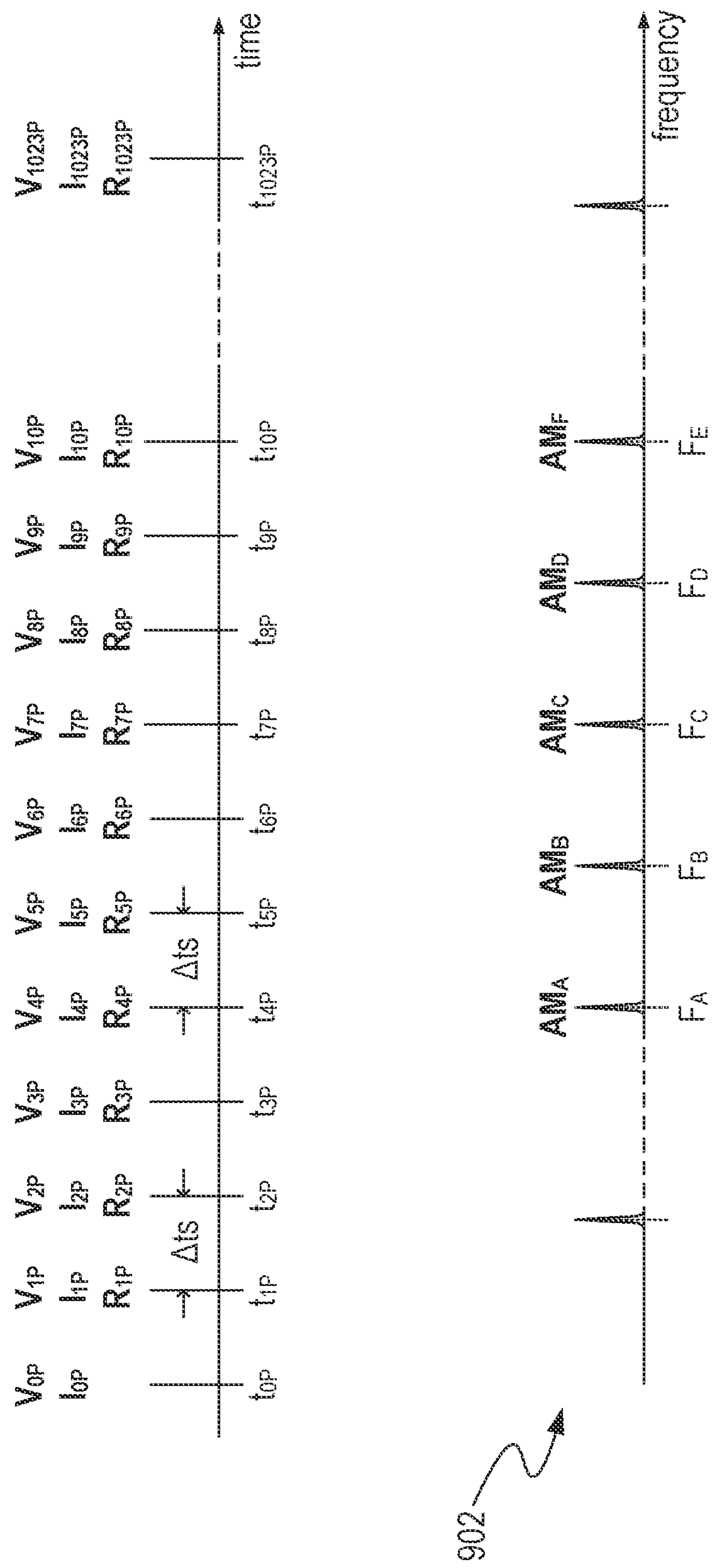
FIG. 9 illustrates an example of a diagram of a set of calculated values of internal resistance of a battery module transforming to an impedance spectrum of the battery module, in an embodiment of the present invention.

FIG. 9 illustrates an example of a diagram of a set of calculated values of internal resistance of a battery module transforming to an impedance spectrum of the battery module, in an embodiment of the present invention. FIG. 9 is described in combination with FIG. 2A, FIG. 2B, FIG. 3, FIG. 4A, FIG. 4B, FIG. 5, FIG. 6, FIG. 7, and FIG. 8.

As mentioned above, the current and voltages of the battery modules 202_1-202_*n* can be sensed synchronously and periodically. In the example of FIG. 9, $I_{0P}$, $I_{1P}$, $I_{2P}$, etc., can represent the values of the battery current $I_{BAT}$ obtained by the BMU 208 at time $t_{0P}$, $t_{1P}$, $t_{2P}$, etc., respectively. $V_{0P}$, $V_{1P}$, $V_{2P}$, etc., can represent the values of the battery voltage of a battery module 202_*i* (i=1, 2, . . . , n) obtained by the BMU 208 at time $t_{0P}$, $t_{1P}$, $t_{2P}$, etc., respectively. The internal resistance value $R_{1P}$ of the battery module 202_*i* at time $t_{1P}$ can be given by: $R_{1P}=(V_{1P}-V_{0P})/(I_{1P}-I_{0P})$. The internal resistance values $R_{2P}$, $R_{3P}$, etc., can be calculated in a similar manner. Thus, the BMU 208 can obtain a set of internal resistance values $R_{1P}$, $R_{2P}$, $R_{3P}$, etc., of the battery module 202_*i*.

In an embodiment, the BMU 208 can apply the fast Fourier transform on the internal resistance values $R_{1P}$, $R_{2P}$, $R_{3P}$, etc., of the battery module 202_*i* to generate information for an impedance spectrum of the battery module 202_*i*. In FIG. 9, the frequency-domain graph 902 shows an example of an impedance spectrum associated with the internal resistance of the battery module 202_*i*. The information for the impedance spectrum can include multiple frequency values (e.g., including $F_A$, $F_B$, F, etc.) and multiple amplitude values (e.g., including $AM_A$, $AM_B$, $AM_C$, etc.) that correspond to the frequency values respectively.

In an embodiment, as used herein, the phrase "apply the fast Fourier transform on the internal resistance values" and the like mean applying the fast Fourier transform algorithm on the internal resistance values to generate a result of the algorithm, and the result includes information for the impedance spectrum. For example, an algorithm module (e.g., represented by computer-readable instructions) for the fast Fourier transform can be stored in a storage unit (e.g., a non-transitory computer storage media) of the BMU 208. The BMU 208 can execute the algorithm module based on the internal resistance values or, in other words, can input the internal resistance values to the algorithm module. As a result, the BMU 208 can obtain the information for the impedance spectrum from the algorithm module.

As mentioned above, the impedance spectrum of the battery module 202_*i* can have a particular pattern in a particular situation. If the battery module 202_*i* is in a healthy state, then the information for the real-time impedance spectrum will match pre-stored information for the impedance spectrum. More specifically, in an embodiment, before mass-producing the battery modules, a testing process is performed on samples of the battery modules. The testing process may include measuring the current and voltage of a sample of the battery modules (hereinafter, a battery-module sample) in different situations, e.g., different operation modes, different SOCs, different temperatures, etc. The testing process may further include generating information (hereinafter, after-testing information) for impedance spectrums for the battery-module sample based on the measurement results. In an embodiment, the after-testing information may be pre-stored a storage unit (e.g., a non-transitory computer storage media). The BMU 208 can acquire the after-testing information from the storage unit.

Accordingly, in an embodiment, if the real-time information for the impedance spectrum of a battery module does not match the pre-stored information for the impedance spectrum, then the BMU 208 may determine that a fault or a potential fault is present in the battery module. In an embodiment, a first impedance spectrum does not match a second impedance spectrum when a difference between the first impedance spectrum and the second impedance spectrum is greater than a preset threshold or is outside of a predetermined standard.

In addition, in the testing process, an impedance spectrum versus SOC database may be generated by mapping the impedance spectrum to the SOC of the battery-module sample. Similar to the after-testing information, the impedance spectrum versus SOC database may be stored in an abovementioned storage unit. As a result, the BMU 208 may determine an SOC of the battery module by comparing the real-time information for the impedance spectrum with the information in the impedance spectrum versus SOC database.

Moreover, in the testing process, an impedance spectrum versus temperature database may be generated by mapping the impedance spectrum to the internal temperature of the battery-module sample. The impedance spectrum versus temperature database may be stored in the abovementioned storage unit. As a result, the BMU 208 may determine the internal temperature of the battery module by comparing the real-time information for the impedance spectrum with the information in the impedance spectrum versus temperature database. The determined internal temperature value can be used to further improve the accuracy of determining the SOC of the battery module.

Furthermore, as mentioned above, the current and voltages of the battery modules 202_1-202_*n* can be sensed synchronously and periodically. Thus, the BMU 208 can generate a set of impedance spectrums respectively corresponding to the battery modules 202_1-202_*n*, and the impedance spectrums can represent statuses of the battery modules 202_1-202_*n* at the same time or in the same time frame. In an embodiment, the BMU 208 may compare the impedance spectrums with each other to determine whether a fault (or a potential fault) is present in a battery module of the battery modules 202_1-202_*n*. For example, if the BMU 208 identifies an impedance spectrum that is very different from the other impedance spectrums, then the BMU 208 may determine that a fault (or a potential fault) is present in the battery module corresponding to that impedance spectrum.

Accordingly, an embodiment according to the present invention provides a battery monitoring system that synchronously and periodically measures/senses a battery current and battery voltages of a set of battery modules. Based on the synchronously and periodically measured current and voltages, the battery monitoring system can calculate multiple sets of values for the internal resistances of the battery modules, and apply a fast Fourier transform to the internal resistance values to generate information for impedance spectrums of the battery modules. The battery monitoring system may further analyze the impedance spectrums to determine, for example, an SOC, an SOH, and/or internal temperature of the battery modules. Furthermore, in an embodiment, the battery monitoring system may compare the impedance spectrums with each other to determine whether a fault (or a potential fault) is present in a battery module of the battery modules.

While the foregoing description and drawings represent embodiments of the present invention, it will be understood that various additions, modifications, and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

I claim:

1. A battery monitoring device comprising:

a monitoring circuit operable for sensing a status of a first battery module;

a communication port operable for receiving a sensing command, provided by a battery management unit, through a serial communication link, wherein said serial communication link comprises a plurality of battery monitoring devices including said battery monitoring device, wherein said plurality of battery monitoring devices is coupled to a plurality of battery modules including said first battery module, and wherein each device of said plurality of battery monitoring devices is operable for sensing a status of a respective battery module of said plurality of battery modules at a sensing time point; and a control circuit, coupled to said monitoring circuit and said communication port, and operable for starting timing of a preset time delay when said control circuit begins executing said sensing command, and further operable for controlling said monitoring circuit to sense said status of said first battery module when said preset time delay expires such that said monitoring circuit senses said status of said first battery module at a time point that is synchronized with said sensing time point, wherein said control circuit is further operable for controlling said communication port to send information comprising said status of said first battery module to said battery management unit through said serial communication link, and wherein said first battery module comprises a plurality of battery cells, wherein said monitoring circuit is operable for performing a first sensing operation on each battery cell of said plurality of battery cells at a respective first time point and for performing a second sensing operation on said each battery cell at a respective second time point, wherein a time interval between each said respective first time point and each said respective second time point has a respective middle time point, and wherein the middle time points for said plurality of battery cells coincide with each other.

2. The battery monitoring device of claim 1, wherein said monitoring circuit comprises at least two analog-to-digital converters (ADCs), and wherein each ADC of said at least two ADCs is operable for performing said first sensing operation and said second sensing operation on a portion of said plurality of battery cells.

3. The battery monitoring device of claim 1, wherein said battery monitoring device is operable for forwarding said sensing command to a next battery monitoring device of said plurality of battery monitoring devices in said serial communication link, and wherein a length of said preset time delay is determined according to a position of said battery monitoring device in said serial communication link and a propagation delay between said battery monitoring device receiving said sensing command and said next battery monitoring device receiving said sensing command.

4. The battery monitoring device of claim 3, wherein said length of said preset time delay is determined according to the following equation:

$$T=(n-i)*P\_DLY+\Delta t,$$

wherein T represents said preset time delay, n represents the total number of said battery monitoring devices in said serial communication link, i is a number representing said position of said battery monitoring device in said serial communication link, Δt represents a time interval equal to or greater than zero, and P_DLY represents said propagation delay of said battery monitoring device.

5. A battery monitoring system comprising:

a serial communication link comprising a plurality of battery monitoring devices operable for sensing statuses of a plurality of battery modules at a sensing time point, wherein said plurality of battery monitoring devices includes a first battery monitoring device, and wherein said first battery monitoring device comprises:

a monitoring circuit operable for sensing a status of a first battery module of said plurality of battery modules;

a communication port operable for receiving a first sensing command from a battery management unit through said serial communication link; and a control circuit, coupled to said monitoring circuit and said communication port, and operable for executing said first sensing command, for starting timing of a preset time delay when said control circuit begins executing said first sensing command, and for controlling said monitoring circuit to sense said status of said first battery module when said preset time delay expires such that said monitoring circuit senses said status of said first battery module at a time point that is synchronized with said sensing time point, wherein said control circuit is further operable for controlling said communication port to send information comprising said status of said first battery module to said battery management unit through said serial communication link, and wherein said first battery module comprises a plurality of battery cells, wherein said monitoring circuit is operable for performing a first sensing operation on each battery cell of said plurality of battery cells at a respective first time point and for performing a second sensing operation on said each battery cell at a respective second time point, wherein a time interval between each said first time point and each said second time point has a respective middle time point, and wherein the middle time points for said plurality of battery cells coincide with each other.

6. The battery monitoring system of claim 5, wherein said monitoring circuit is operable for performing said first sensing operation to obtain a first sensed voltage and is further operable for performing said second sensing operation to obtain a second sensed voltage, and wherein said battery management unit is operable for calculating an average value of said first and second sensed voltages.

7. The battery monitoring system of claim 5, wherein said serial communication link comprises a looped serial communication link, wherein said first sensing command is transmitted through an uplink of said looped serial communication link, and wherein a second sensing command, generated by said battery management unit, is transmitted through a downlink of said looped serial communication link.

8. The battery monitoring system of claim 5, wherein said battery monitoring system is operable for periodically sensing a current flowing through said plurality of battery modules and is further operable for periodically sensing a voltage of said first battery module synchronously with said periodically sensing said current, to acquire a plurality of datasets, wherein each dataset of said plurality of datasets comprises a value of said current and a value of said voltage that are measured in a time frame of a plurality of time frames, and wherein said battery monitoring system is operable for calculating a plurality of values of internal resistance of said first battery module, and wherein each value of said plurality of values is calculated based on values in a first dataset of said plurality of datasets and values in a second dataset of said plurality of datasets.

9. The battery monitoring system of claim 8, wherein said battery monitoring system is operable for applying a fast Fourier transform on said plurality of values to generate information for an impedance spectrum of said first battery module.

10. The battery monitoring system of claim 5, wherein said first battery monitoring device is operable for forwarding said first sensing command to a second battery monitoring device of said plurality of battery monitoring devices in said serial communication link, and wherein a length of said preset time delay is determined according to a position of said first battery monitoring device in said serial communication link and a propagation delay between said first battery monitoring device receiving said first sensing command and said second battery monitoring device receiving said first sensing command from said first battery monitoring device.

11. The battery monitoring system of claim 10, wherein said length of said preset time delay is determined according to the following equation:

$$T=(n-i)*P\_Dly+\Delta t,$$

wherein T represents said preset time delay, n represents the total number of said battery monitoring devices in said serial communication link, i is a number representing said position of said first battery monitoring device in said serial communication link, Δt represents a time interval equal to or greater than zero, and P_DLY represents said propagation delay of said first battery monitoring device.

12. A method for monitoring a plurality of battery modules, said method comprising:

receiving, using a first battery monitoring device of a plurality of battery monitoring devices, a first sensing command transmitted by a battery management unit via a serial communication link, wherein said serial communication link comprises said plurality of battery monitoring devices;

starting timing of a preset time delay when said first battery monitoring device begins executing said first sensing command;

sensing, using said plurality of battery monitoring devices, statuses of said plurality of battery modules at a sensing time point, wherein said first battery monitoring device senses a status of a first battery module of said plurality of battery modules when said preset time delay expires such that said first battery monitoring device senses said status of said first battery module at a time point that is synchronized with said sensing time point, wherein said first battery module comprises a plurality of battery cells;

sending information comprising said status of said first battery module to said battery management unit through said serial communication link, performing a first sensing operation on each battery cell of said plurality of battery cells at a respective first time point to obtain first sensing data;

performing a second sensing operation on said each battery cell at a respective second time point to obtain second sensing data, wherein a time interval between each said first time point and each said second time point has a respective middle time point, and wherein the middle time points for said plurality of battery cells coincide with each other; and generating information comprising said status of said first battery module according to said first sensing data and said second sensing data.

13. The method of claim 12, wherein said generating information comprises:

performing said first sensing operation to obtain a first sensed voltage;

performing said second sensing operation to obtain a second sensed voltage; and calculating an average value of said first and second sensed voltages.

14. The method of claim 12, wherein said serial communication link comprises a looped serial communication link, and wherein said method further comprises:

transmitting said first sensing command through an uplink of said looped serial communication link; and transmitting a second sensing command, generated by said battery management unit, through a downlink of said looped serial communication link.

15. The method of claim 12, wherein said generating information comprises:

periodically sensing a current flowing through said plurality of battery modules;

periodically sensing a voltage of said first battery module synchronously with said periodically sensing said current, to acquire a plurality of datasets, wherein each dataset of said plurality of datasets comprises a value of said current and a value of said voltage that are measured in a time frame of a plurality of time frames;

calculating a plurality of values of internal resistance of said first battery module, wherein each value of said plurality of values is calculated based on values in a first dataset of said plurality of datasets and values in a second dataset of said plurality of datasets; and applying a fast Fourier transform on said plurality of values to generate information for an impedance spectrum of said first battery module.

16. The method of claim 12, further comprising:

forwarding, using said first battery monitoring device, said first sensing command to a second battery monitoring device of said plurality of battery monitoring devices in said serial communication link; and determining a length of said preset time delay according to a position of said first battery monitoring device in said serial communication link and a propagation delay between said first battery monitoring device receiving said first sensing command and said second battery monitoring device receiving said first sensing command from said first battery monitoring device.

17. The method of claim 16, wherein said length of said preset time delay is determined according to the following equation:

$$T=(n-i)*P\_DLY+\Delta t,$$

wherein T represents said preset delay time, n represents the total number of said battery monitoring devices in said serial communication link, i is a number representing said position of said first battery monitoring device in said serial communication link, Δt represents a time interval equal to or greater than zero, and P_DLY represents said propagation delay of said first battery monitoring device.

* * * * *